US012537500B2

(12) United States Patent
Kimura

(10) Patent No.: US 12,537,500 B2
(45) Date of Patent: *Jan. 27, 2026

(54) ACOUSTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 202 days.

This patent is subject to a terminal disclaimer.

(21) Appl. No.: 18/239,811

(22) Filed: Aug. 30, 2023

(65) Prior Publication Data

US 2023/0412138 A1 Dec. 21, 2023

Related U.S. Application Data

(63) Continuation of application No. PCT/JP2022/008612, filed on Mar. 1, 2022.

(Continued)

(51) Int. Cl.
*H03H 9/02* (2006.01)
*H03H 9/05* (2006.01)
*H03H 9/13* (2006.01)

(52) U.S. Cl.
CPC .... *H03H 9/02015* (2013.01); *H03H 9/02228* (2013.01); *H03H 9/0504* (2013.01); *H03H 9/131* (2013.01)

(58) Field of Classification Search
CPC .......... H03H 9/02015; H03H 9/02228; H03H 9/0504; H03H 9/131; H03H 9/173

(Continued)

(56) References Cited

U.S. PATENT DOCUMENTS

2012/0205754 A1 8/2012 Iwamoto
2017/0250671 A1 8/2017 Omura et al.
(Continued)

FOREIGN PATENT DOCUMENTS

JP   2012257019 A   12/2012
WO   2011052551 A1   5/2011
(Continued)

OTHER PUBLICATIONS

International Search Report in PCT/JP2022/008612, mailed May 17, 2022, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support with a thickness in a first direction, a piezoelectric layer in the first direction, and an interdigital transducer electrode in the first direction with first electrode fingers in a second direction, a first busbar electrode connected to the first electrode fingers, second electrode fingers in the second direction and facing corresponding ones of the first electrode fingers in a third direction, and a second busbar electrode connected to the second electrode fingers. The support has a hollow adjacent to the piezoelectric layer and at least partially overlapping the interdigital transducer electrode. The piezoelectric layer has a first through hole penetrating the piezoelectric layer between at least one first electrode finger and the second busbar electrode. The first through hole communicates with the hollow, has a length in the third direction, and overlaps a portion of a second electrode finger.

20 Claims, 22 Drawing Sheets

Related U.S. Application Data

(60) Provisional application No. 63/154,845, filed on Mar. 1, 2021.

(58) Field of Classification Search
USPC .................................. 333/186–188, 193–196
See application file for complete search history.

(56) References Cited

U.S. PATENT DOCUMENTS

2018/0097501 A1\* 4/2018 Kikuchi ................... H03H 3/02
2021/0105002 A1\* 4/2021 Yantchev ........... H03H 9/02015

FOREIGN PATENT DOCUMENTS

| WO | 2016098526 | A1 | 6/2016 |
| WO | 2016147687 | A1 | 9/2016 |

OTHER PUBLICATIONS

Written Opinion in PCT/JP2022/008612, mailed May 17, 2022, 3 pages.
Kimura, "Acoustic Wave Device", U.S. Appl. No. 18/239,836, filed Aug. 30, 2023.

\* cited by examiner

ACOUSTIC WAVE DEVICE

CROSS REFERENCE TO RELATED APPLICATIONS

This application claims the benefit of priority to Provisional Patent Application No. 63/154,845 filed on Mar. 1, 2021 and is a Continuation Application of PCT Application No. PCT/JP2022/008612 filed on Mar. 1, 2022. The entire contents of each application are hereby incorporated herein by reference.

BACKGROUND OF THE INVENTION

1. Field of the Invention

The present disclosure relates to an acoustic wave device.

2. Description of the Related Art

An acoustic wave device is disclosed in Japanese Unexamined Patent Application Publication No. 2012-257019.

SUMMARY OF THE INVENTION

In an acoustic wave device described in Japanese Unexamined Patent Application Publication No. 2012-257019, leakage of acoustic wave energy in the direction of extension of electrode fingers may degrade a Q factor.

Preferred embodiments of the present invention solve the problem described above and improve the Q factor.

An acoustic wave device according to an aspect of a preferred embodiment of the present invention includes a support with a thickness extending in a first direction, a piezoelectric layer extending in the first direction of the support, and an interdigital transducer electrode extending in the first direction of the piezoelectric layer and including a plurality of first electrode fingers extending in a second direction orthogonal to the first direction, a first busbar electrode connected to the plurality of first electrode fingers, a plurality of second electrode fingers extending in the second direction and facing corresponding ones of the plurality of first electrode fingers in a third direction orthogonal to the second direction, and a second busbar electrode connect to the plurality of second electrode fingers, wherein the support includes a hollow on a side thereof adjacent to the piezoelectric layer and at least partially overlapping the interdigital transducer electrode in plan view in the first direction, the piezoelectric layer includes at least one first through hole penetrating the piezoelectric layer in a region between at least one first electrode finger and the second busbar electrode in plan view in the first direction, and the first through hole communicates with the hollow, has a length in the third direction, and overlaps a portion of at least one second electrode finger in plan view in the first direction.

Preferred embodiments of the present disclosure improve the Q factor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present disclosure will now be described in detail on the basis of the drawings. Note that the preferred embodiments described below do not limit the present disclosure. The preferred embodiments of the present disclosure are presented for illustrative purposes. In modifications and second and other preferred embodiments that follow, where some components of different preferred embodiments can be replaced or combined, the description of matters common to the first preferred embodiment will be omitted and differences alone will be described. In particular, the same operations and effects achieved by the same configurations will not be mentioned in the description of each preferred embodiment.

First Preferred Embodiment

Figure 1A:
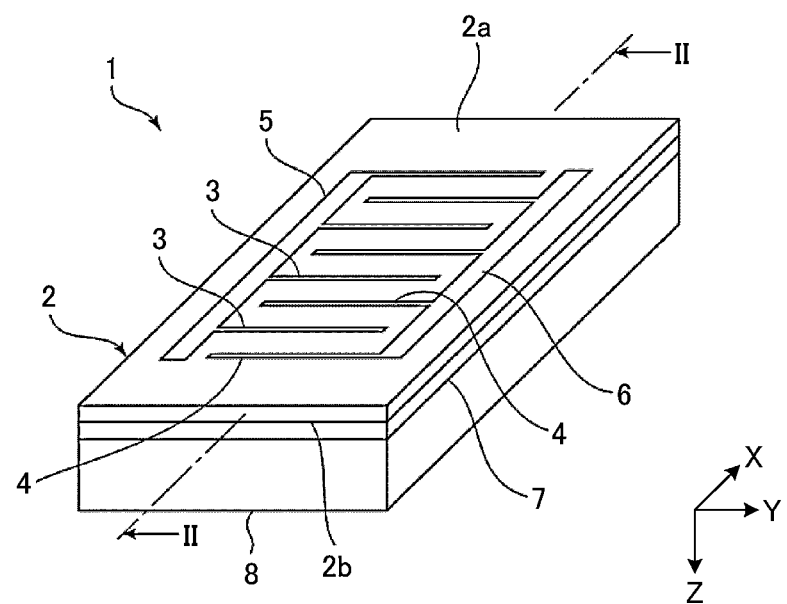
FIG. 1A is a perspective view of an acoustic wave device according to a first preferred embodiment of the present invention.
Figure 1B:
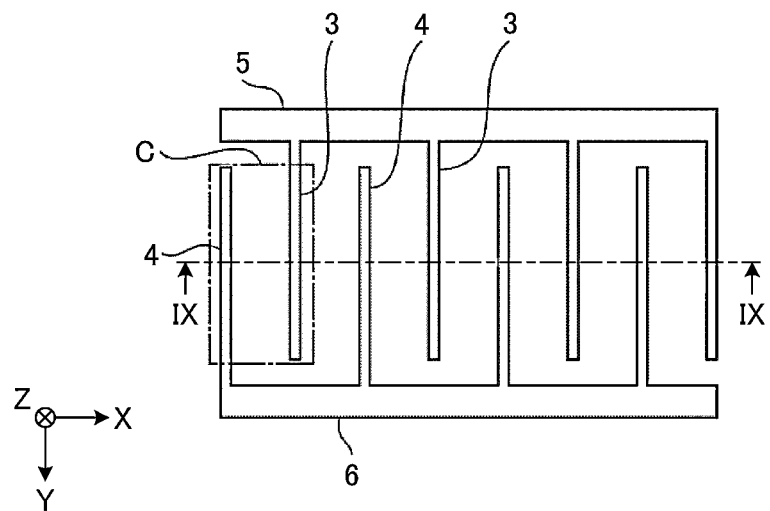
FIG. 1B is a plan view of an electrode structure according to the first preferred embodiment of the present invention.

FIG. 1A is a perspective view of an acoustic wave device according to a first preferred embodiment. FIG. 1B is a plan view of an electrode structure according to the first preferred embodiment.

An acoustic wave device 1 according to the first preferred embodiment includes a piezoelectric layer 2 made of $LiNbO_3$. The piezoelectric layer 2 may be made of $LiTaO_3$. The cut-angles of $LiNbO_3$ and $LiTaO_3$ are Z-cut in the first preferred embodiment. The cut-angles of $LiNbO_3$ and $LiTaO_3$ may be rotated Y-cut or X-cut. It is preferable that the propagation orientation be Y-propagation and X-propagation ±about 30°, for example.

The thickness of the piezoelectric layer 2 is not particularly limited. For effective excitation of first-order thickness shear mode, the thickness of the piezoelectric layer 2 is preferably greater than or equal to about 50 nm and less than or equal to about 1000 nm, for example.

The piezoelectric layer 2 includes a first principal surface 2a and a second principal surface 2b opposite each other in the Z direction. Electrode fingers 3 and 4 are arranged on the first principal surface 2a.

Here, the electrode finger 3 is an example of a "first electrode finger", and the electrode finger 4 is an example of a "second electrode finger". In FIGS. 1A and 1B, a plurality of electrode fingers 3 are a plurality of "first electrode fingers" connected to a first busbar electrode 5, and a plurality of electrode fingers 4 are a plurality of "second electrode fingers" connected to a second busbar electrode 6. The plurality of electrode fingers 3 and the plurality of electrode fingers 4 are interdigitated with each other. The electrode fingers 3, the electrode fingers 4, the first busbar electrode 5, and the second busbar electrode 6 thus define an interdigital transducer (IDT) electrode 30.

The electrode fingers 3 and 4 are rectangular or substantially rectangular in shape and have a length direction. In a direction orthogonal to the length direction, adjacent ones of the electrode fingers 3 and 4 face each other. Both the length direction of the electrode fingers 3 and 4 and the direction orthogonal to the length direction of the electrode fingers 3 and 4 are directions that cross the thickness direction of the piezoelectric layer 2. Therefore, adjacent ones of the electrode fingers 3 and 4 can also be considered facing each other in the direction crossing the thickness direction of the piezoelectric layer 2. Hereinafter, the thickness direction of the piezoelectric layer 2 may be described as a Z direction (or first direction), the length direction of the electrode fingers 3 and 4 may be described as a Y direction (or second direction), and the direction orthogonal to the electrode fingers 3 and 4 may be described as an X direction (or third direction).

The length direction of the electrode fingers 3 and 4 may be interchanged with the direction orthogonal to the length direction of the electrode fingers 3 and 4 illustrated in FIGS. 1A and 1B. That is, the electrode fingers 3 and 4 may extend in the direction in which the first busbar electrode 5 and the second busbar electrode 6 extend in FIGS. 1A and 1B. In this case, the first busbar electrode 5 and the second busbar electrode 6 extend in the direction in which the electrode fingers 3 and 4 extend in FIGS. 1A and 1B. A plurality of pairs of adjacent electrode fingers 3 and 4, the electrode finger 3 being connected to one potential and the electrode finger 4 being connected to the other potential, are arranged in the direction orthogonal to the length direction of the electrode fingers 3 and 4.

Here, the electrode fingers 3 and 4 adjacent to each other are not in direct contact, but are spaced from each other. The electrode fingers 3 and 4 adjacent to each other are not provided with other electrodes (including other electrode fingers 3 and 4) connected to hot and ground electrodes therebetween. The number of pairs of adjacent electrode fingers 3 and 4 does not necessarily need to be an integer, and there may be, for example, 1.5 pairs or 2.5 pairs.

A center-to-center distance, or pitch, between the electrode fingers 3 and 4 is preferably greater than or equal to about 1 µm and less than or equal to about 10 µm, for example. The center-to-center distance between the electrode fingers 3 and 4 is a distance from the center of the width dimension of the electrode finger 3 in the direction orthogonal to the length direction of the electrode finger 3 to the center of the width dimension of the electrode finger 4 in the direction orthogonal to the length direction of the electrode finger 4.

When the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance between the electrode fingers 3 and 4 is the average of the center-to-center distances between adjacent ones of the greater than or equal to 1.5 pairs of electrode fingers 3 and 4.

The width of the electrode fingers 3 and 4, or the dimension of the electrode fingers 3 and 4 in the direction in which the electrode fingers 3 and 4 face each other, is preferably greater than or equal to about 150 nm and less than or equal to about 1000 nm, for example. The center-to-center distance between the electrode fingers 3 and 4 is a distance from the center of the dimension (width dimension) of the electrode finger 3 in the direction orthogonal to the length direction of the electrode finger 3 to the center of the dimension (width dimension) of the electrode finger 4 in the direction orthogonal to the length direction of the electrode finger 4.

In the first preferred embodiment, where a Z-cut piezoelectric layer is used, the direction orthogonal to the length direction of the electrode fingers 3 and 4 is a direction orthogonal to the polarization direction of the piezoelectric layer 2. This is not applicable when a piezoelectric body with other cut-angles is used as the piezoelectric layer 2. Here, the term "orthogonal" may refer not only to being exactly orthogonal, but also to being substantially orthogonal (e.g., the angle between the direction orthogonal to the length direction of the electrode fingers 3 and 4 and the polarization direction is about 90°±10').

Figure 2:
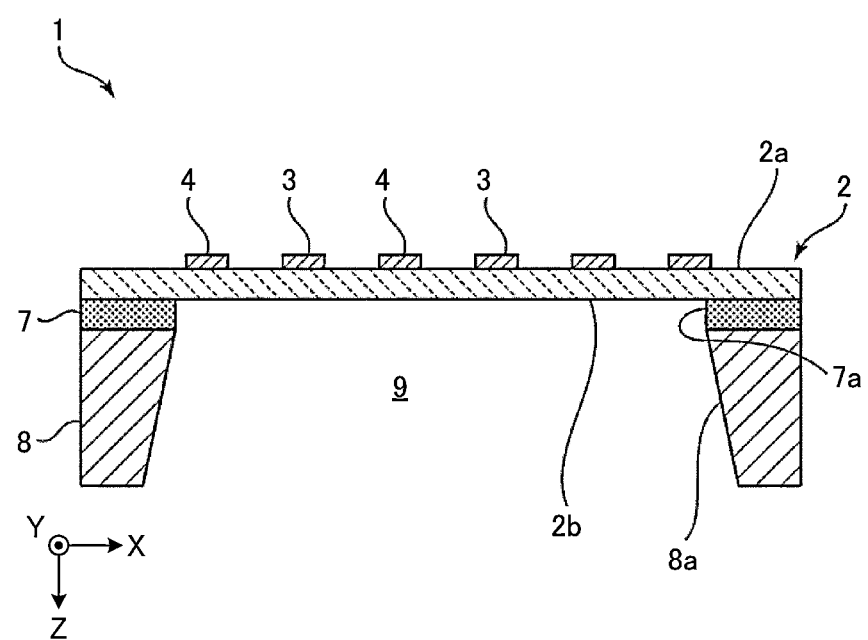
FIG. 2 is a cross-sectional view taken along line II-II of FIG. 1A.

A support substrate 8 is disposed adjacent to the second principal surface 2b of the piezoelectric layer 2, with a dielectric film 7 interposed therebetween. The dielectric film 7 and the support substrate 8 have a frame shape. As illustrated in FIG. 2, the dielectric film 7 and the support substrate 8 are provided with cavities 7a and 8a, respectively, which form a hollow (air gap) 9.

The hollow 9 is provided to allow vibration of an excitation region C of the piezoelectric layer 2. Therefore, the support substrate 8 is disposed adjacent to the second principal surface 2b, with the dielectric film 7 interposed therebetween, so as not to overlap at least one pair of electrode fingers 3 and 4. The dielectric film 7 is optional. That is, the support substrate 8 may be disposed on the second principal surface 2b of the piezoelectric layer 2, either directly or indirectly.

The dielectric film 7 is made of silicon oxide. The dielectric film 7 can be made of an appropriate insulating material, such as silicon nitride or alumina, other than silicon oxide.

The support substrate 8 is made of Si. The plane orientation of the Si substrate on the surface thereof adjacent to the piezoelectric layer 2 may be (100), (110), or (111). It is preferable that the Si be a high-resistance Si with a resistivity of greater than or equal to about 4 kΩ, for example. The support substrate 8 can also be made of an appropriate insulating material or semiconductor material. Examples of the material used to form the support substrate 8 include piezoelectric materials, such as aluminum oxide, lithium tantalate, lithium niobate, and crystals; various ceramics, such as alumina, magnesia, sapphire, silicon nitride, aluminum nitride, silicon carbide, zirconia, cordierite, mullite, steatite, and forsterite; dielectrics, such as diamond and glass; and a semiconductor, such as gallium nitride.

The plurality of electrode fingers 3 and 4, the first busbar electrode 5, and the second busbar electrode 6 are made of an appropriate metal, such as Al, or an appropriate alloy, such as AlCu alloy. In the first preferred embodiment, the electrode fingers 3 and 4, the first busbar electrode 5, and the second busbar electrode 6 have a multilayer structure of a Ti film and an Al film on the Ti film. The Ti film may be replaced by a different adhesion layer.

To drive the acoustic wave device 1, an alternating-current voltage is applied between the plurality of electrode fingers 3 and the plurality of electrode fingers 4. More specifically, an alternating-current voltage is applied between the first busbar electrode 5 and the second busbar electrode 6. This can produce resonance characteristics using first-order thickness shear mode bulk waves excited in the piezoelectric layer 2.

In the acoustic wave device 1, d/p is less than or equal to about 0.5, for example, where d is the thickness of the piezoelectric layer 2 and p is the center-to-center distance between any adjacent electrode fingers 3 and 4 of the plurality of pairs of electrode fingers 3 and 4. This allows effective excitation of the first-order thickness shear mode bulk waves and can produce good resonance characteristics. It is more preferable that d/p be less than or equal to about 0.24, for example. This produces better resonance characteristics.

As in the first preferred embodiment, when the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance p between the adjacent electrode fingers 3 and 4 is the average center-to-center distance between all adjacent electrode fingers 3 and 4.

In the acoustic wave device 1 of the first preferred embodiment configured as described above, the Q factor does not decrease easily even if the number of pairs of the electrode fingers 3 and 4 is reduced for the purpose of size reduction. This is because the acoustic wave device 1 is a resonator that does not require reflectors on both sides, and thus does not suffer significant propagation loss. The acoustic wave device 1 does not require reflectors, because it uses first-order thickness shear mode bulk waves.

Figure 3A:
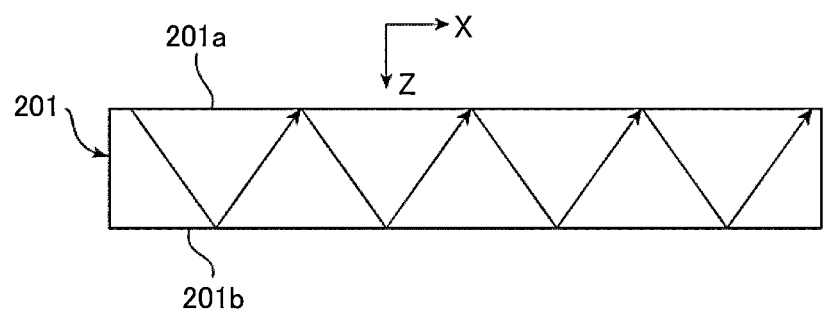
FIG. 3A is a schematic cross-sectional view for explaining Lamb waves propagating in a piezoelectric layer of Comparative Example.
Figure 3B:
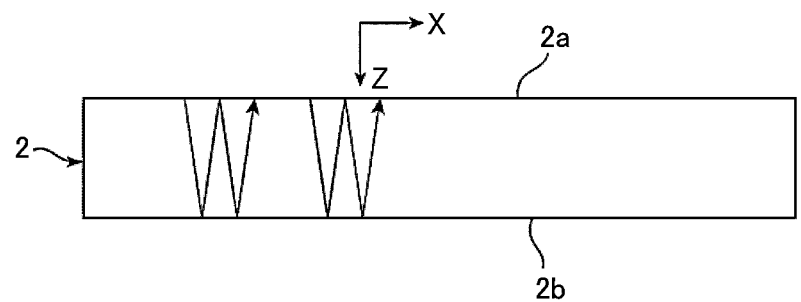
FIG. 3B is a schematic cross-sectional view for explaining first-order thickness shear mode bulk waves propagating in a piezoelectric layer of the first preferred embodiment of the present invention.
Figure 4:
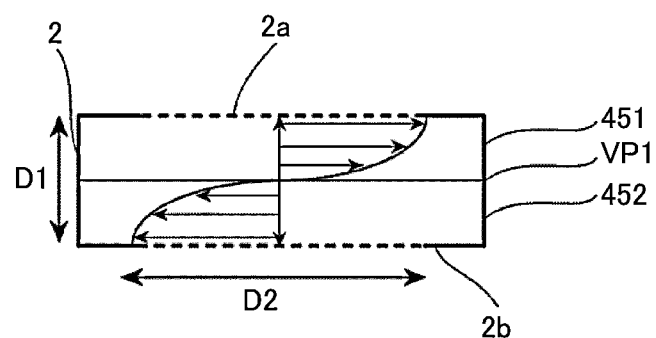
FIG. 4 is a schematic cross-sectional view for explaining an amplitude direction of first-order thickness shear mode bulk waves propagating in the piezoelectric layer of the first preferred embodiment of the present invention.

FIG. 3A is a schematic cross-sectional view for explaining Lamb waves propagating in a piezoelectric layer of Comparative Example. FIG. 3B is a schematic cross-sectional view for explaining first-order thickness shear mode bulk waves propagating in the piezoelectric layer of the first preferred embodiment. FIG. 4 is a schematic cross-sectional view for explaining an amplitude direction of first-order thickness shear mode bulk waves propagating in the piezoelectric layer of the first preferred embodiment.

FIG. 3A illustrates Lamb waves propagating in a piezoelectric layer of an acoustic wave device, such as that described in Japanese Unexamined Patent Application Publication No. 2012-257019. As illustrated in FIG. 3A, the waves propagate in a piezoelectric layer 201 as indicated by arrows. The piezoelectric layer 201 includes a first principal surface 201a and a second principal surface 201b. A thickness direction, which connects the first principal surface 201a and the second principal surface 201b, is the Z direction. The X direction is a direction in which the electrode fingers 3 and 4 of the interdigital transducer electrode 30 are arranged. The Lamb waves propagate in the X direction, as illustrated in FIG. 3A. Although the entire piezoelectric layer 201 vibrates, the Lamb waves (plate waves) propagate in the X direction. Reflectors are thus provided on both sides to produce resonance characteristics. This causes wave propagation loss and results in a low Q factor when the number of pairs of the electrode fingers 3 and 4 is reduced for size reduction.

In the acoustic wave device of the first preferred embodiment, as illustrated in FIG. 3B, vibration displacement takes place in the thickness shear direction. Therefore, the waves propagate substantially in the direction connecting the first principal surface 2a and the second principal surface 2b of the piezoelectric layer 2, that is, substantially in the Z direction and resonate. In other words, the X direction component of the waves is much smaller than the Z direction component of the waves. Since the wave propagation in the Z direction produces resonance characteristics, the acoustic wave device requires no reflectors. This prevents propagation loss that occurs during propagation to reflectors. Therefore, the Q factor does not decrease easily even if the number of electrode pairs, each including the electrode fingers 3 and 4, is reduced for the purpose of size reduction.

As illustrated in FIG. 4, the amplitude direction of first-order thickness shear mode bulk waves in a first region 451 included in the excitation region C (see FIG. 1B) of the piezoelectric layer 2 is opposite that in a second region 452 included in the excitation region C. FIG. 4 schematically illustrates how bulk waves behave when a voltage that makes the potential of the electrode finger 4 higher than that of the electrode finger 3 is applied between the electrode fingers 3 and 4. In the excitation region C, the first region 451 is a region between a virtual plane VP1 and the first principal surface 2a, and the second region 452 is a region between the virtual plane VP1 and the second principal surface 2b. The virtual plane VP1 is orthogonal to the thickness direction of the piezoelectric layer 2 and divides the piezoelectric layer 2 into two.

The acoustic wave device 1 includes at least one electrode pair including the electrode fingers 3 and 4. Since the acoustic wave device 1 is not configured to propagate waves in the X direction, it is not necessarily required that there be more than one electrode pair including the electrode fingers 3 and 4. That is, the acoustic wave device 1 simply requires at least one electrode pair.

For example, the electrode finger 3 is an electrode connected to the hot potential, and the electrode finger 4 is an electrode connected to the ground potential. Alternatively, the electrode finger 3 and the electrode finger 4 may be connected to the ground potential and the hot potential, respectively. In the first preferred embodiment, the at least one electrode pair is a combination of electrodes, one connected to the hot potential and the other connected to the ground potential, as described above, and no floating electrode is provided.

Figure 5:
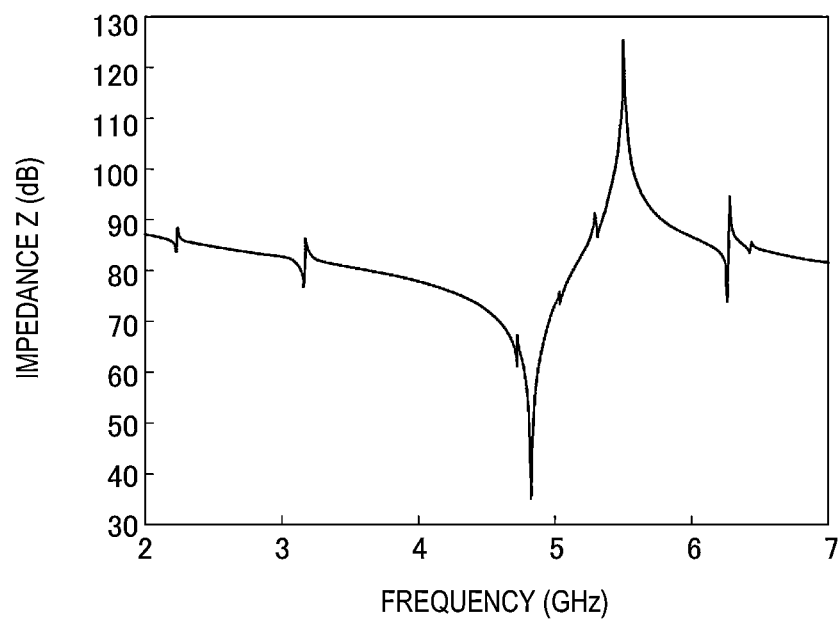
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device according to the first preferred embodiment. The design parameters of an example of the acoustic wave device 1 having the resonance characteristics illustrated in FIG. 5 are as follows.

Piezoelectric layer 2: LiNbO$_3$ with Euler angles (0°, 0°, 90°)
Thickness of piezoelectric layer 2: 400 nm
Length of excitation region C (see FIG. 1B): 40 μm
Number of electrode pairs, each including electrode fingers 3 and 4: 21 pairs
Center-to-center distance (pitch) between electrode fingers 3 and 4: 3 μm
Width of electrode fingers 3 and 4: 500 nm d/p: 0.133
Dielectric film 7: 1 μm-thick silicon oxide film
Support substrate 8: Si The excitation region C (see FIG. 1B) is a region where the electrode fingers 3 and 4 overlap, as viewed in the X direction orthogonal to the length direction of the electrode fingers 3 and 4. The length of the excitation region C is a dimension of the excitation region C along the length direction of the electrode fingers 3 and 4. The excitation region C is an example of an "overlap region".

In the first preferred embodiment, all electrode pairs, each including the electrode fingers 3 and 4, have the same interelectrode distance. That is, the electrode fingers 3 and 4 are arranged with an equal pitch.

As is clear from FIG. 5, good resonance characteristics with a fractional bandwidth of about 12.5%, for example, are obtained without reflectors.

In the first preferred embodiment, d/p is less than or equal to about 0.5 and more preferably less than or equal to about 0.24, for example, where d is the thickness of the piezoelectric layer 2 and p is the center-to-center distance between the electrode fingers 3 and 4. This will now be described with reference to FIG. 6.

Figure 6:
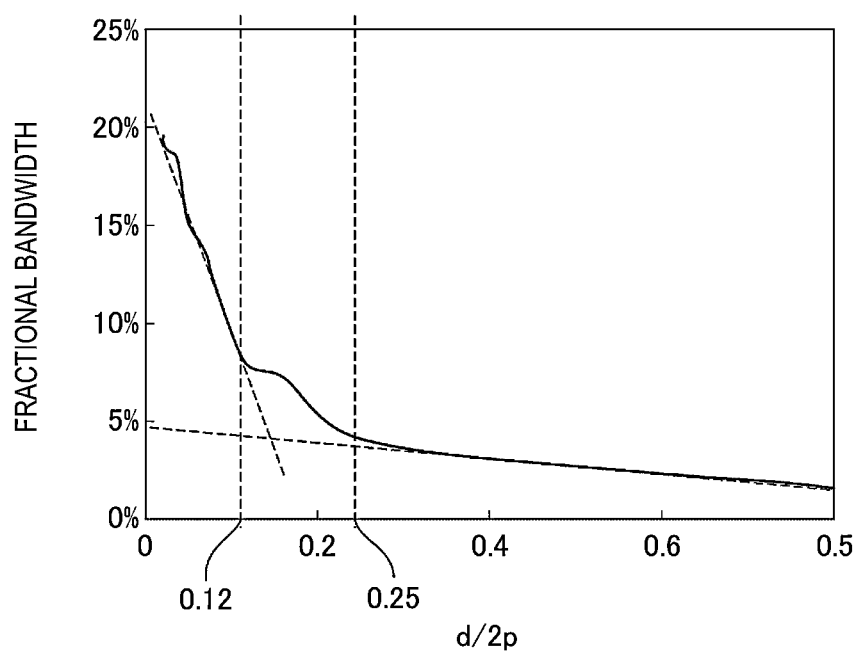
FIG. 6 is an explanatory diagram illustrating a relation between d/2p and a fractional bandwidth of the acoustic wave device of the first preferred embodiment of the present invention serving as a resonator, where p is a center-to-center distance or average center-to-center distance between adjacent electrodes and d is an average thickness of the piezoelectric layer.

A plurality of acoustic wave devices are produced by varying d/2p of the acoustic wave device having the resonance characteristics illustrated in FIG. 5. FIG. 6 is an explanatory diagram illustrating a relation between d/2p and a fractional bandwidth of the acoustic wave device of the first preferred embodiment serving as a resonator, where p is the center-to-center distance between adjacent electrodes or the average center-to-center distance between adjacent electrodes, and d is the average thickness of the piezoelectric layer 2.

As illustrated in FIG. 6, if d/2p exceeds about 0.25 (or d/p>0.5), the fractional bandwidth falls below about 5%, for example, even when d/p is adjusted. On the other hand, if d/2p about 0.25 (or d/p about 0.5) is satisfied, the fractional bandwidth can be made greater than or equal to about 5% by varying d/p within the range, for example, that is, a resonator having a high coupling coefficient can be obtained. If d/2p is less than or equal to about 0.12, that is, if d/p is less than or equal to about 0.24, for example, the fractional bandwidth can be made as high as about 7% or more, for example. Additionally, by adjusting d/p within this range, a resonator with a wider fractional bandwidth and a higher coupling coefficient can be produced. Thus, by making d/p less than or equal to about 0.5, for example, a resonator with a higher coupling coefficient using first-order thickness shear mode bulk waves can be obtained.

It is simply required that there be at least one electrode pair. In the case of one electrode pair, p is the center-to-center distance between adjacent electrode fingers 3 and 4. In the case of greater than or equal to 1.5 electrode pairs, p may be the average center-to-center distance between adjacent electrode fingers 3 and 4.

If the piezoelectric layer 2 varies in thickness, the average thickness of the piezoelectric layer 2 may be used as the thickness d of the piezoelectric layer 2.

Figure 7:
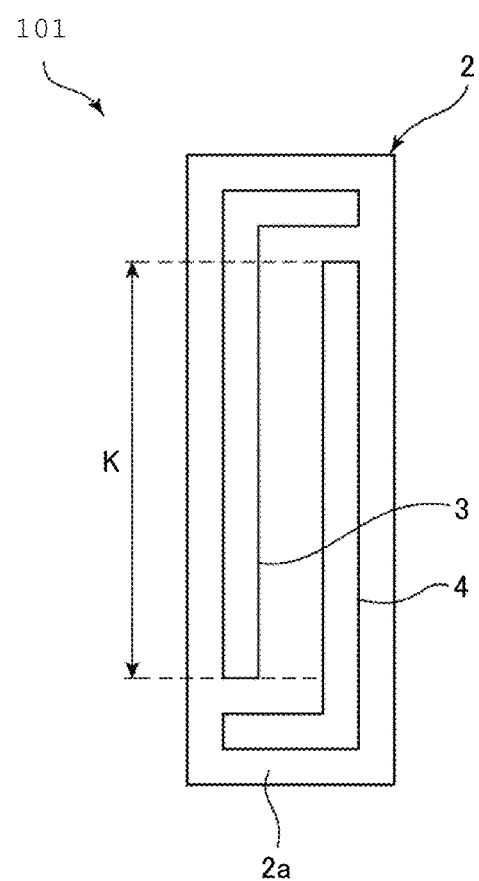
FIG. 7 is a plan view illustrating an example of one electrode pair in an acoustic wave device according to the first preferred embodiment of the present invention.

FIG. 7 is a plan view illustrating an example of one electrode pair in an acoustic wave device according to the first preferred embodiment. An acoustic wave device 101 includes one electrode pair including the electrode fingers 3 and 4 on the first principal surface 2a of the piezoelectric layer 2. Note that K in FIG. 7 indicates an overlap width. As described above, the acoustic wave device according to the present disclosure may include only one electrode pair. Even in this case, the first-order thickness shear mode bulk waves can be effectively excited if d/p is less than or equal to about 0.5, for example.

The excitation region C of the acoustic wave device 1 is a region where any adjacent electrode fingers 3 and 4 of the plurality electrode fingers 3 and 4 overlap as viewed in the direction in which the adjacent electrode fingers 3 and 4 face each other. It is preferable in the acoustic wave device 1 that MR≤1.75 (d/p)+0.075 be satisfied, where MR is a metallization ratio MR of the adjacent electrode fingers 3 and 4 to the excitation region C. Spurious emission can be effectively reduced in this case. This will be described with reference to FIG. 8 and FIG. 9.

Figure 8:
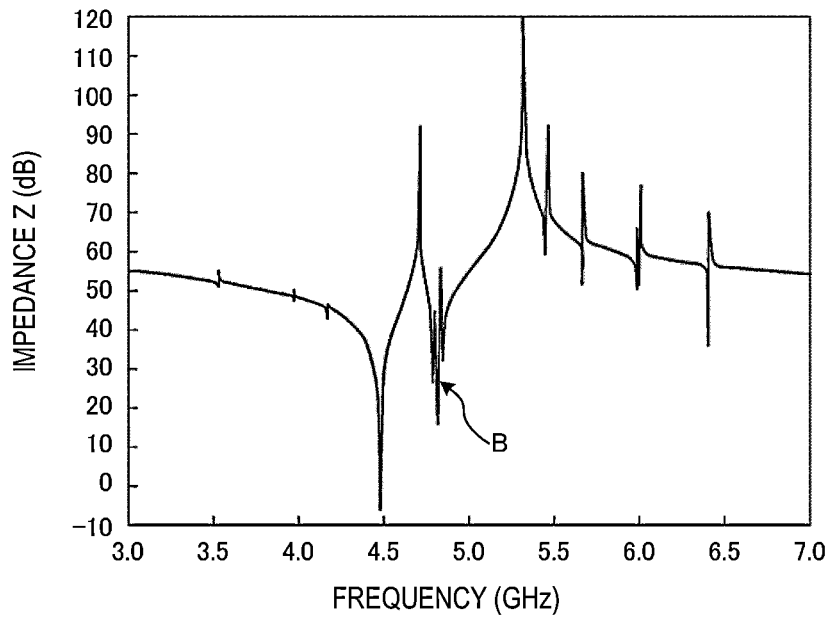
FIG. 8 is a reference diagram illustrating an example of resonance characteristics of the acoustic wave device according to the first preferred embodiment of the present invention.

FIG. 8 is a reference diagram illustrating an example of resonance characteristics of the acoustic wave device according to the first preferred embodiment. Arrow B indicates a spurious emission appearing between the resonant frequency and the anti-resonant frequency. In this example, d/p is about 0.08, LiNbO₃ has Euler angles (0°, 0°, 90°), and the metallization ratio MR is about 0.35, for example.

The metallization ratio MR will now be described with reference to FIG. 1B. To focus on one pair of electrode fingers 3 and 4 of the electrode structure in FIG. 1B, the description assumes that only the one pair of electrode fingers 3 and 4 is provided. In this case, a region enclosed by a dash-dot line is the excitation region C. When the electrode fingers 3 and 4 are viewed in the direction orthogonal to the length direction of the electrode fingers 3 and 4, or viewed in the direction in which the electrode fingers 3 and 4 face each other, the excitation region C includes a portion of the electrode finger 3 overlapping the electrode finger 4, a portion of the electrode finger 4 overlapping the electrode finger 3, and a portion between the electrode fingers 3 and 4 where the electrode fingers 3 and 4 face each other. The metallization ratio MR is the ratio of the area of the electrode fingers 3 and 4 in the excitation region C to the area of the excitation region C. That is, the metallization ratio MR is the ratio of the area of a metallized portion to the area of the excitation region C.

When a plurality of pairs of electrode fingers 3 and 4 are provided, MR may be the ratio of the area of metallized portions included in all excitation regions C to the sum of the areas of the excitation regions C.

Figure 9:
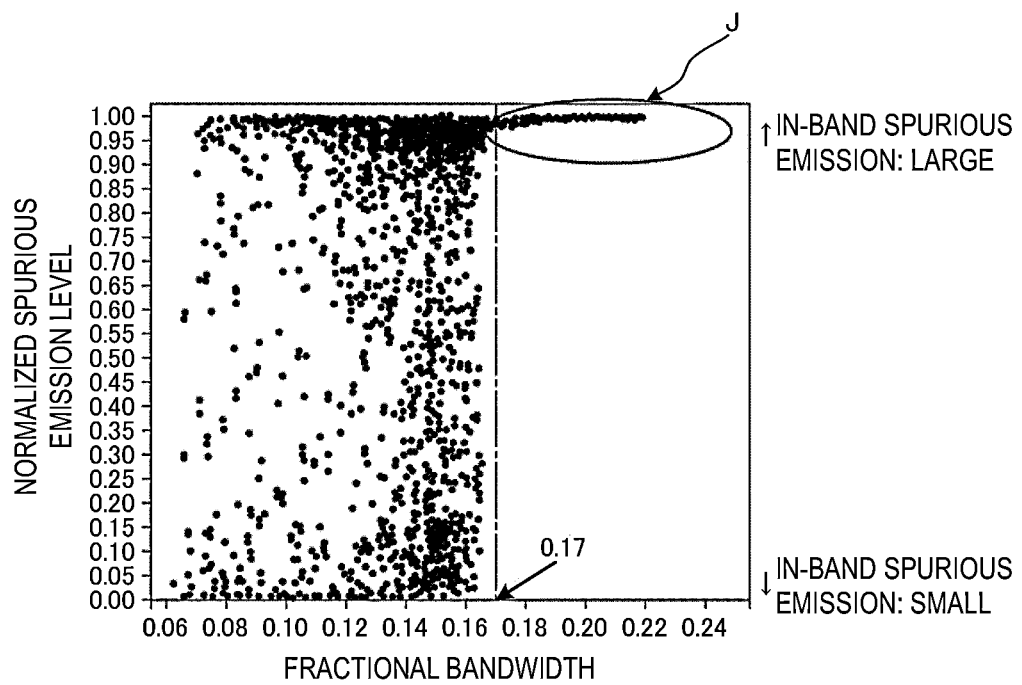
FIG. 9 is an explanatory diagram illustrating a relation between the fractional bandwidth of the acoustic wave device of the first preferred embodiment of the present invention constituting each of many acoustic wave resonators, and the amount of phase rotation of impedance of spurious emission normalized at 180 degrees to represent the level of spurious emission.

FIG. 9 is an explanatory diagram illustrating a relation between the fractional bandwidth of the acoustic wave device of the first preferred embodiment of each of many acoustic wave resonators, and the amount of phase rotation of impedance of spurious emission normalized at 180 degrees to represent the level of spurious emission. The fractional bandwidth is adjusted by varying the film thickness of the piezoelectric layer 2 or the dimensions of the electrode fingers 3 and 4. FIG. 9 illustrates a result of using a Z-cut LiNbO₃ layer as the piezoelectric layer 2. A similar tendency is observed when the piezoelectric layer 2 with other cut-angles is used.

In the region enclosed by oval J in FIG. 9, the level of spurious emission is as high as about 1.0, for example. As is clear from FIG. 9, when the fractional bandwidth exceeds about 0.17 or about 17%, for example, a large spurious emission with a spurious emission level of 1 or higher appears in the pass band even if parameters defining the fractional bandwidth are changed. That is, as in the resonance characteristics illustrated in FIG. 8, a large spurious emission indicated by arrow B appears in the band. Therefore, it is preferable that the fractional bandwidth be less than or equal to about 17%, for example. In this case, adjusting the film thickness of the piezoelectric layer 2 or the dimensions of the electrode fingers 3 and 4 can reduce spurious emission.

Figure 10:
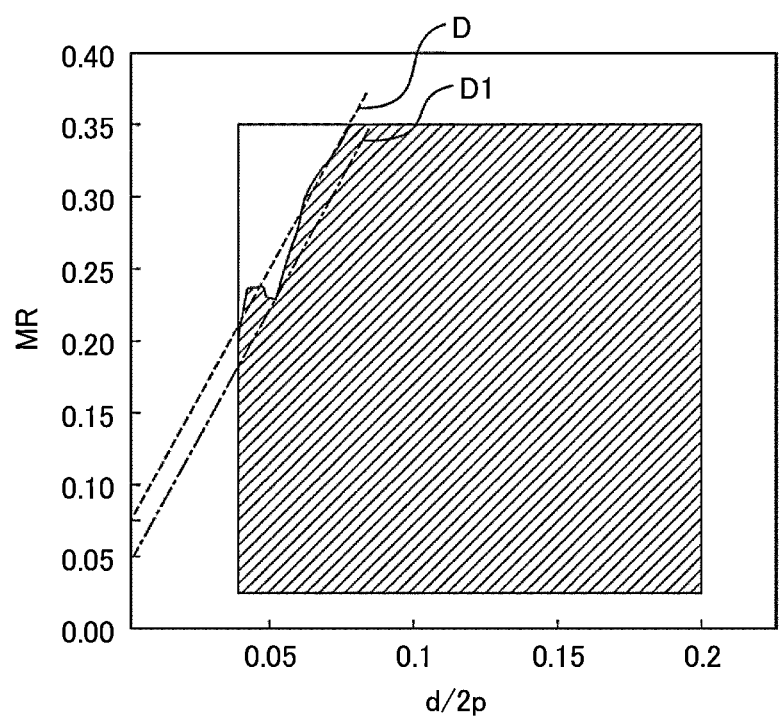
FIG. 10 is an explanatory diagram illustrating a relation between d/2p, metallization ratio MR, and fractional bandwidth.

FIG. 10 is an explanatory diagram illustrating a relation between d/2p, metallization ratio MR, and fractional bandwidth. Various acoustic wave devices 1 of the first preferred embodiment are made by varying d/2p and MR to measure the fractional bandwidths. In FIG. 10, a hatched region to the right of broken line D is a region where the fractional bandwidth is less than or equal to about 17%, for example. The boundary between the hatched and non-hatched regions is represented by MR=3.5 (d/2p)+0.075 or MR=1.75 (d/p)+0.075, and preferably MR 1.75 (d/p)+0.075. In this case, it is easier to make the fractional bandwidth less than or equal to about 17%, for example. A more preferable region is one that is to the right of the boundary represented by MR=3.5 (d/2p)+0.05, indicated by dash-dot line D1 in FIG. 10. That is, if MR 1.75 (d/p)+0.05 is satisfied, the fractional bandwidth can be reliably made less than or equal to about 17%, for example.

Figure 11:
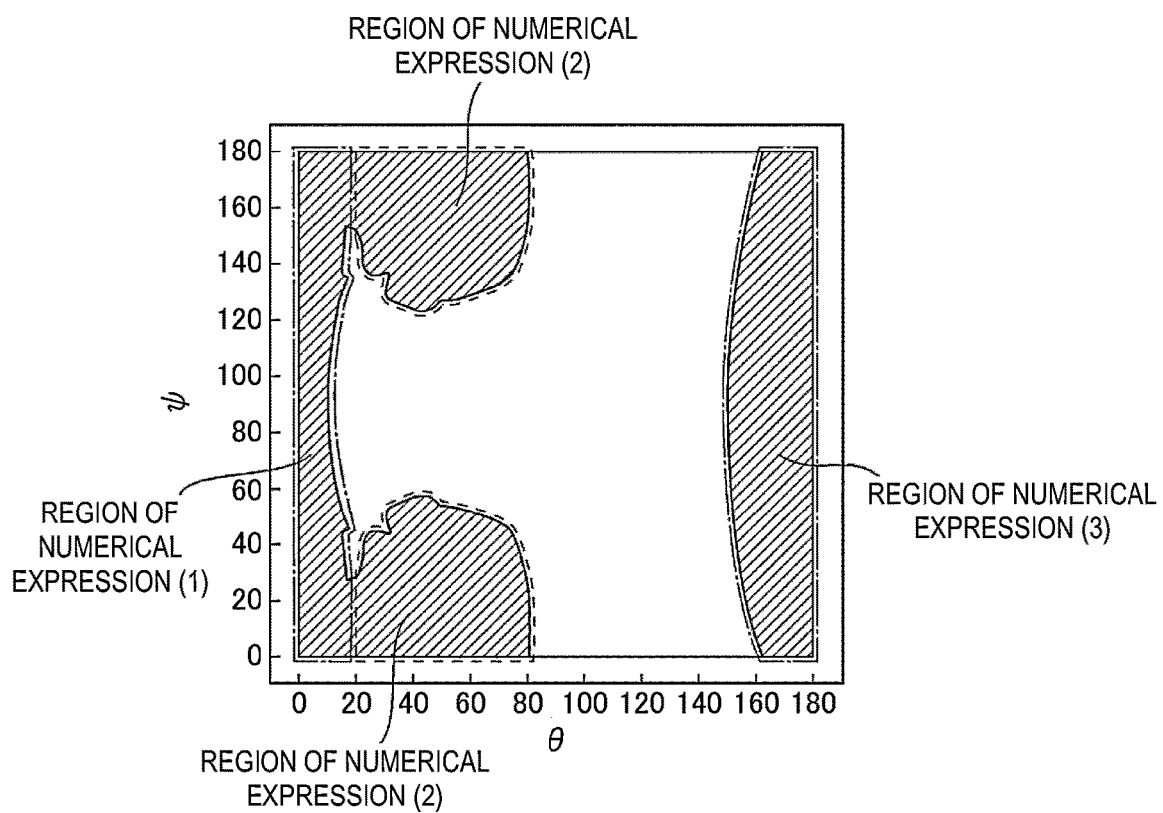
FIG. 11 is an explanatory diagram illustrating a map of fractional bandwidth with respect to Euler angles (0°, θ, ψ) of $LiNbO_3$ obtained when d/p is brought as close as possible to 0.

FIG. 11 is an explanatory diagram illustrating a map of fractional bandwidth with respect to Euler angles (0°, θ, ψ) of LiNbO₃ obtained when d/p is brought as close as possible to 0. Hatched regions in FIG. 11 are regions where a fractional bandwidth of at least greater than or equal to about 5%, for example, can be obtained. By approximating the ranges of these regions, ranges defined by numerical expression (1), numerical expression (2) and numerical expression (3) described below are obtained.

$$(0°\pm10°, 0° \text{ to } 20°, \text{any } \psi) \quad \text{numerical expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{numerical expression (2)}$$

$$(0°\pm10°, [180°-30°(1-(\psi-90)^2/8100)^{1/2}] \text{ to } 180°, \text{any } \psi) \quad \text{numerical expression (3)}$$

The ranges of the Euler angles defined by numerical expression (1), numerical expression (2), or numerical expression (3) are preferable, because a sufficiently wide fractional bandwidth can be achieved.

Figure 12:
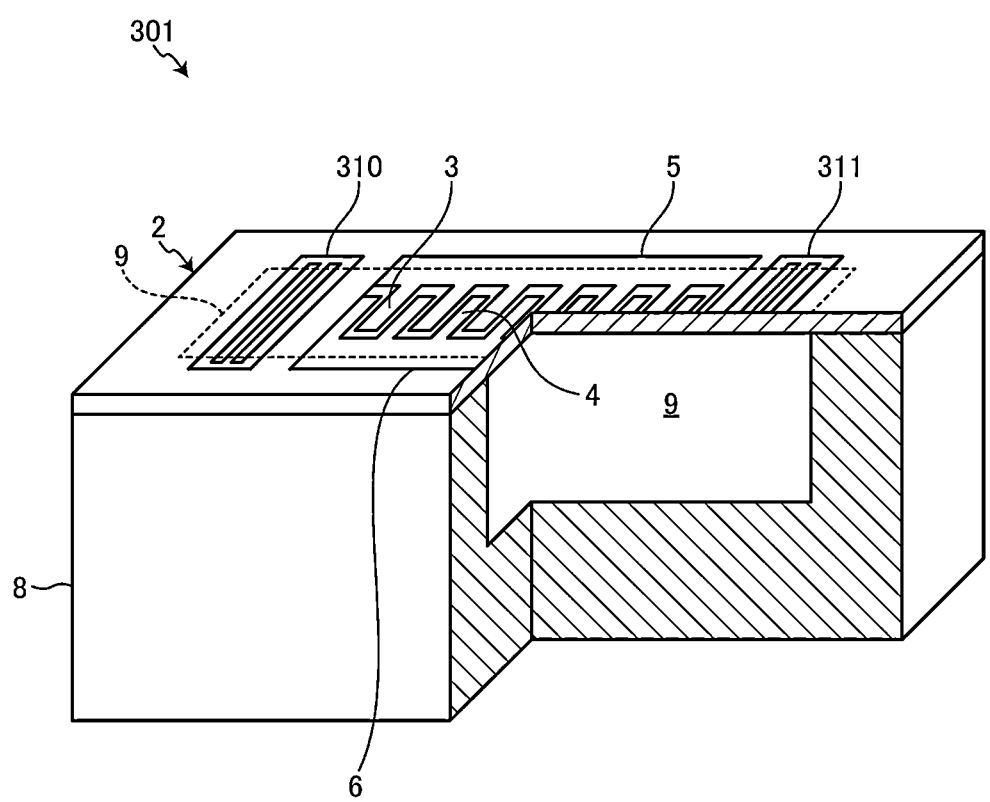
FIG. 12 is a partial cutaway perspective view for explaining an acoustic wave device according to a preferred embodiment of the present invention.

FIG. 12 is a partial cutaway perspective view for explaining an acoustic wave device according to a preferred embodiment of the present disclosure. In FIG. 12, the outer edge of the hollow 9 is indicated by a broken line. The acoustic wave device of the present disclosure may use plate waves. In this case, an acoustic wave device 301 includes reflectors 310 and 311, as illustrated in FIG. 12. The reflectors 310 and 311 are disposed on both sides of the electrode fingers 3 and 4 on the piezoelectric layer 2 in the propagation direction of acoustic waves. In the acoustic wave device 301, Lamb waves (or plate waves) are excited by applying an alternating-current electric field to the electrode fingers 3 and 4 above the hollow 9. With the reflectors 310 and 311 on both sides, the resonance characteristics based on Lamb waves (or plate waves) can be obtained.

As described above, the acoustic wave devices 1 and 101 use first-order thickness shear mode bulk waves. In the acoustic wave devices 1 and 101, the first and second electrode fingers 3 and 4 are adjacent electrodes and d/p is less than or equal to about 0.5, for example, where d is the thickness of the piezoelectric layer 2 and p is the center-to-center distance between the first and second electrode fingers 3 and 4. This can improve the Q factor even when the acoustic wave device is reduced in size.

In the acoustic wave devices 1 and 101, the piezoelectric layer 2 is made of lithium niobate or lithium tantalate. The first principal surface 2a or the second principal surface 2b of the piezoelectric layer 2 includes thereon the first and second electrode fingers 3 and 4 facing each other in the direction crossing the thickness direction of the piezoelectric layer 2. The first and second electrode fingers 3 and 4 are preferably covered with a protective film.

Figure 13:
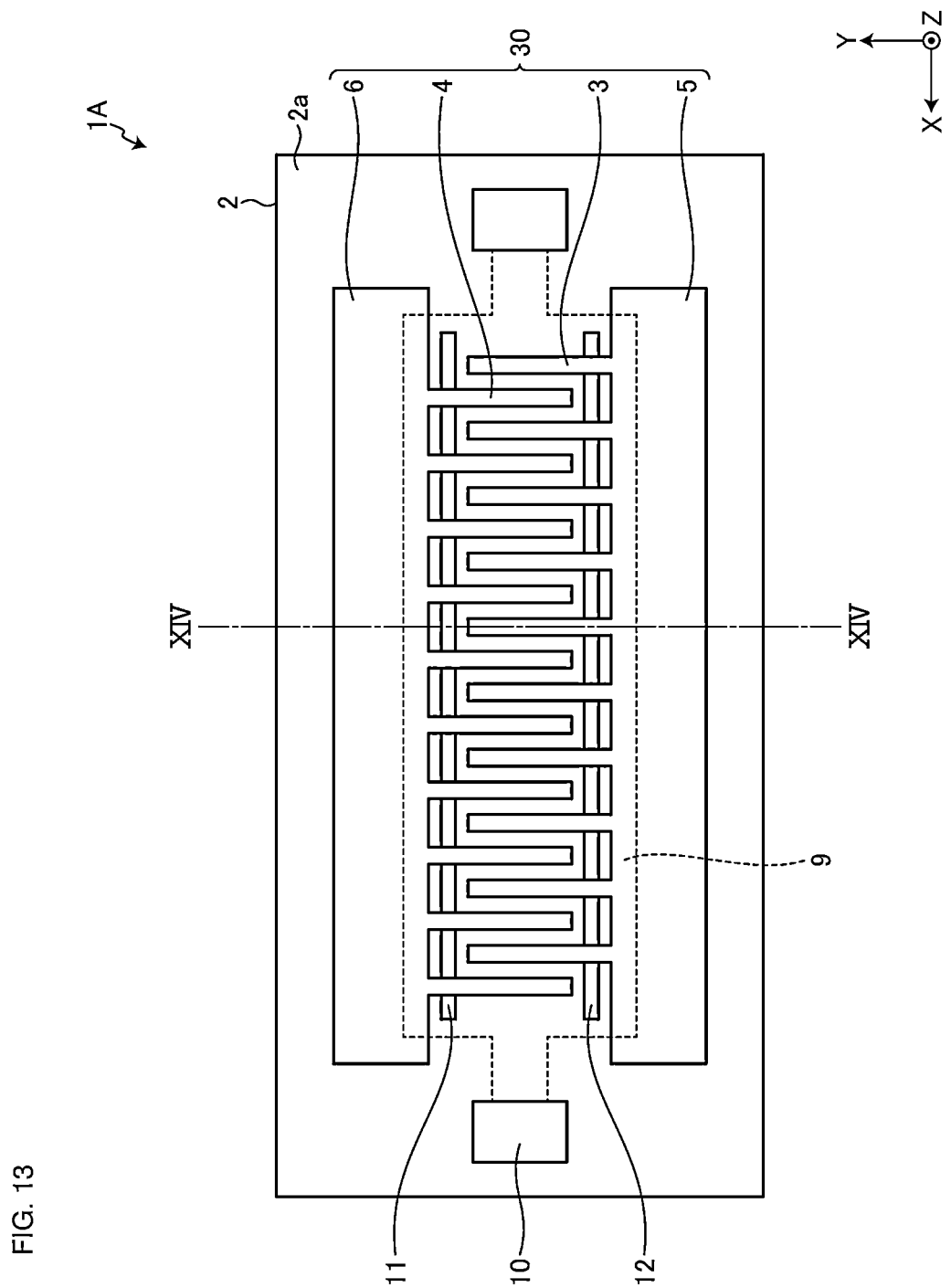
FIG. 13 is a plan view illustrating Example 1 of the acoustic wave device according to the first preferred embodiment of the present invention.
Figure 14:
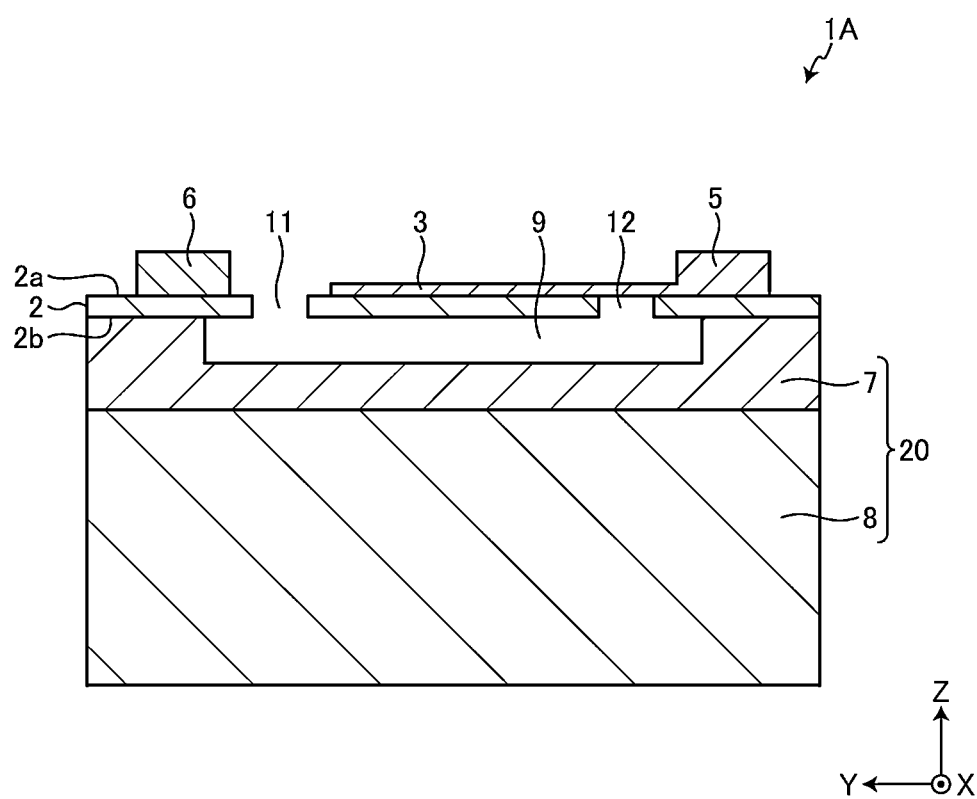
FIG. 14 is an example of a cross-sectional view taken along line XIV-XIV of FIG. 13.

FIG. 13 is a plan view illustrating Example 1 of the acoustic wave device according to the first preferred embodiment. FIG. 14 is a cross-sectional view taken along line XIV-XIV of FIG. 13. As illustrated in FIG. 13, an acoustic wave device 1A according to Example 1 includes an etching through hole 10, a first through hole 11, and a second through hole 12 in the piezoelectric layer 2. As illustrated in FIG. 14, the hollow 9 is disposed on a side of a support member 20 adjacent to the piezoelectric layer 2. In the present preferred embodiment, the hollow 9 is disposed on a side of the dielectric film 7 adjacent to the piezoelectric layer 2.

The etching through hole 10 is a through hole provided in the piezoelectric layer 2 for manufacturing the acoustic wave device 1A. More specifically, the etching through hole 10 is a hole used to pour an etching solution onto a sacrificial layer, in the process of manufacturing the acoustic wave device 1A described below. The etching through hole 10 is a hole penetrating the piezoelectric layer 2 in the Z direction and communicating with the hollow 9. In the present preferred embodiment, the etching through hole 10 is disposed at a position not overlapping the interdigital transducer electrode 30 in plan view in the Z direction. In the example illustrated in FIG. 13, two etching through holes 10 are disposed on both sides of the interdigital transducer electrode 30 in the X direction. The shape of the etching through holes 10 illustrated in FIG. 13 is merely an example, and the etching through holes 10 may be of any shape.

The first through hole 11 is a through hole in the piezoelectric layer 2. As illustrated in FIG. 13, the first through hole 11 is disposed to penetrate the piezoelectric layer 2 in a region between at least one first electrode finger 3 and the second busbar electrode 6, in plan view in the Z direction. As illustrated in FIG. 14, the first through hole 11 penetrates the piezoelectric layer 2 in the Z direction and communicates with the hollow 9. The first through hole 11 has a length in the X direction and is disposed to overlap a portion of at least one second electrode finger 4. That is, the first through hole 11 is disposed to allow at least one second electrode finger 4 to extend over the first through hole 11 in the Y direction. In the example illustrated in FIG. 13, the first through hole 11 is disposed between the first electrode fingers 3 and the second busbar electrode 6 in the Y direction. The first through hole 11 is disposed to overlap a portion of the plurality of second electrode fingers 4 in plan view in the Z direction. The first through hole 11 is in the shape of a rectangle having a length in the X direction, in plan view in the Z direction. In Example 1, in plan view in the Z direction, the length of the first through hole 11 in the X direction is smaller than the length of the second busbar electrode 6 in the X direction. The presence of the first through hole 11 can reduce leakage of acoustic wave energy in the Y direction, and thus can reduce loss of acoustic wave energy. Also, the presence of the first through hole 11 selectively allows leakage of spurious emission, and thus can reduce spurious emission. This can improve the Q factor.

The second through hole 12 is a through hole in the piezoelectric layer 2. As illustrated in FIG. 13, the second through hole 12 is disposed to penetrate the piezoelectric layer 2 in a region between at least one second electrode finger 4 and the first busbar electrode 5, in plan view in the Z direction. As illustrated in FIG. 14, the second through hole 12 penetrates the piezoelectric layer 2 in the Z direction and communicates with the hollow 9. The second through hole 12 has a length in the X direction and is disposed to overlap a portion of at least one first electrode finger 3. That is, the second through hole 12 is disposed to allow at least one first electrode finger 3 to extend over the second through hole 12 in the Y direction. In the example illustrated in FIG. 13, the second through hole 12 is disposed between the second electrode fingers 4 and the first busbar electrode 5 in the Y direction. The second through hole 12 is disposed to overlap a portion of the plurality of first electrode fingers 3 in plan view in the Z direction. The second through hole 12 is in the shape of a rectangle having a length in the X direction, in plan view in the Z direction. In Example 1, the second through hole 12 has the same shape as the first through hole 11 in plan view in the Z direction. That is, the second through hole 12 has the same lengths as the first through hole 11 in the X direction and the Y direction and has the same area as the first through hole 11. The presence of the second through hole 12 can further reduce leakage of acoustic wave energy in the Y direction, and thus can further reduce loss of acoustic wave energy.

Figure 15:
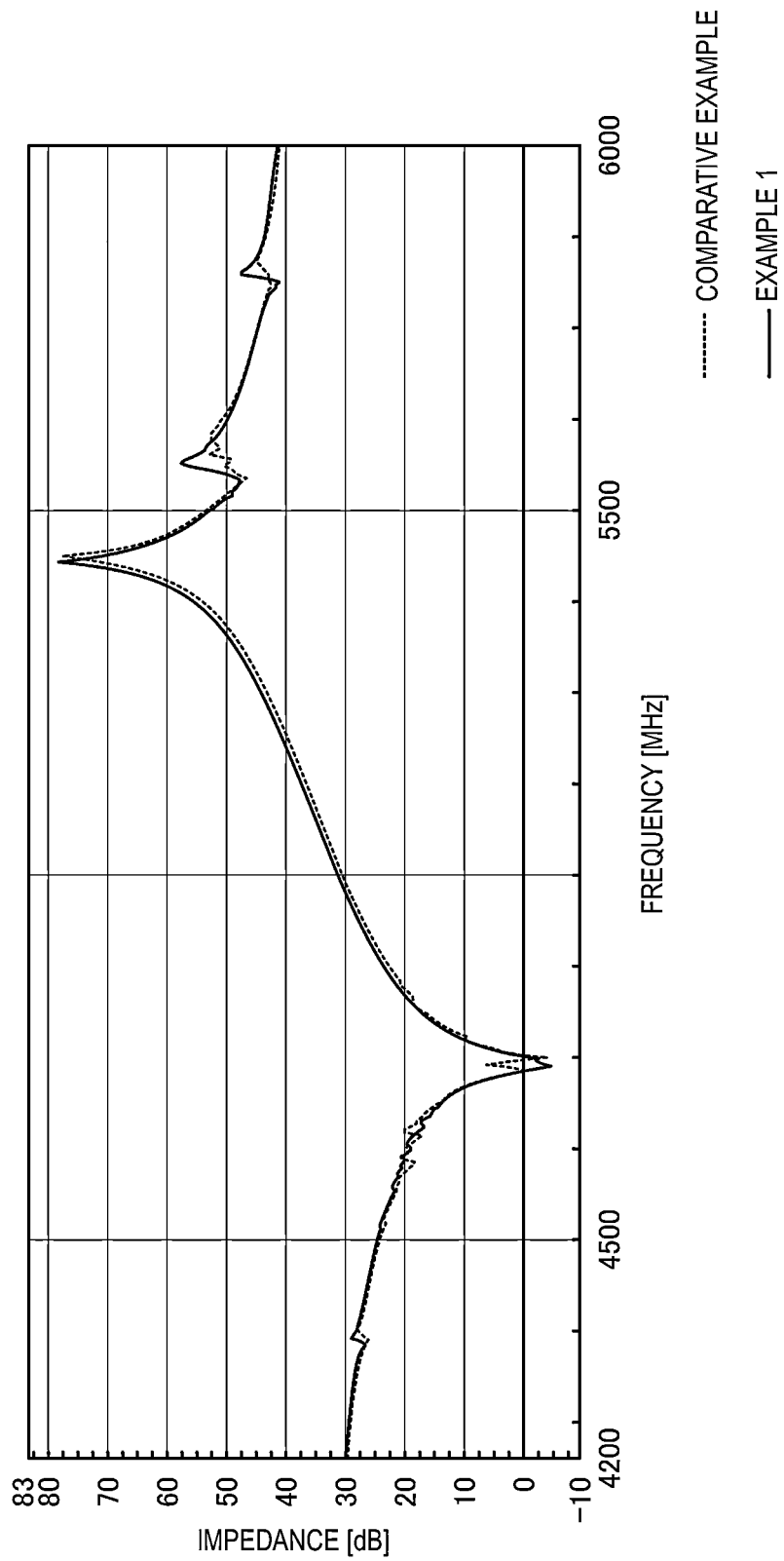
FIG. 15 is a diagram illustrating impedance characteristics of the acoustic wave device according to Example 1 and an acoustic wave device according to Comparative Example.
Figure 16:
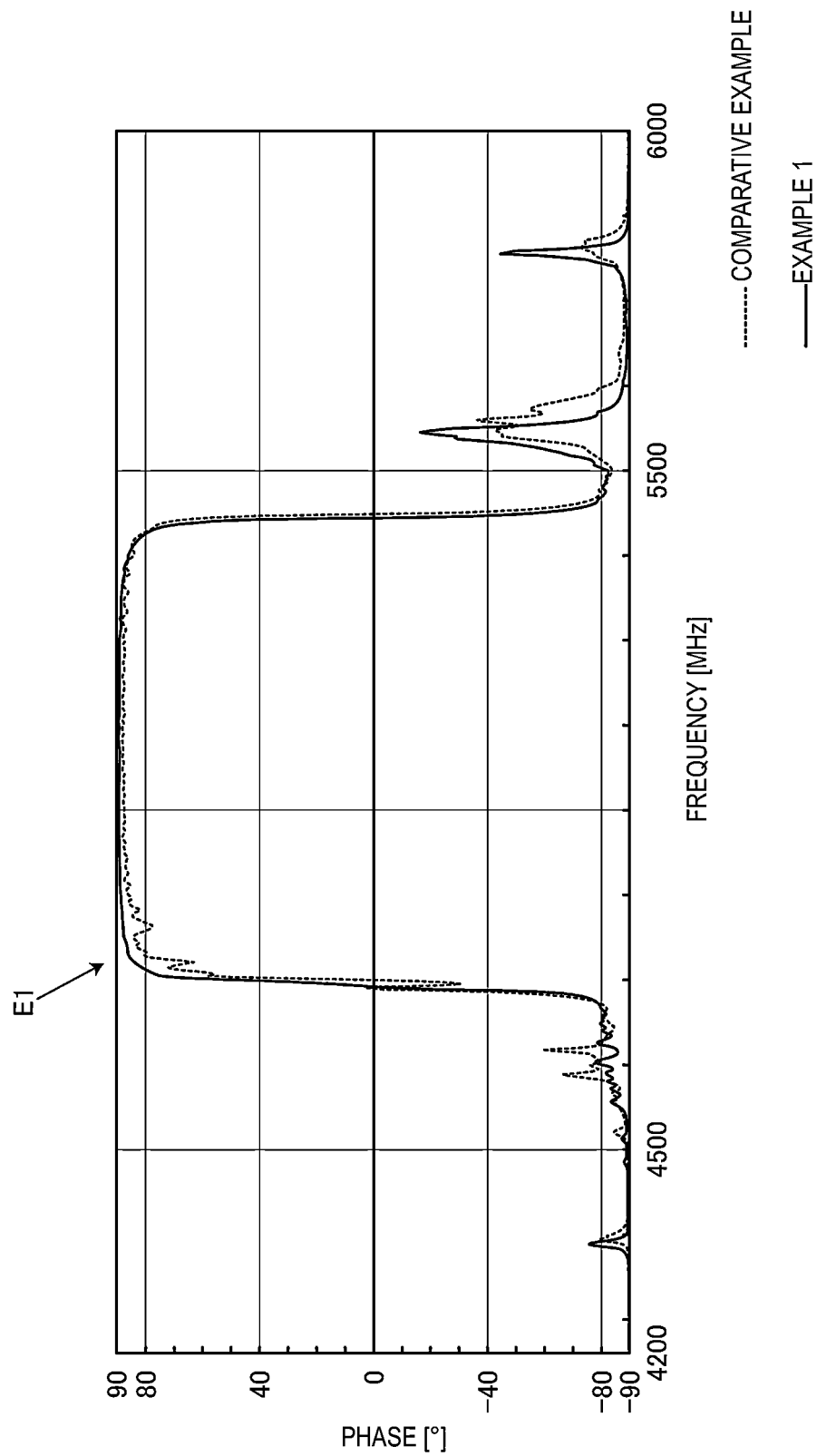
FIG. 16 is a diagram illustrating phase characteristics of the acoustic wave device according to Example 1 and the acoustic wave device according to Comparative Example.
Figure 17:
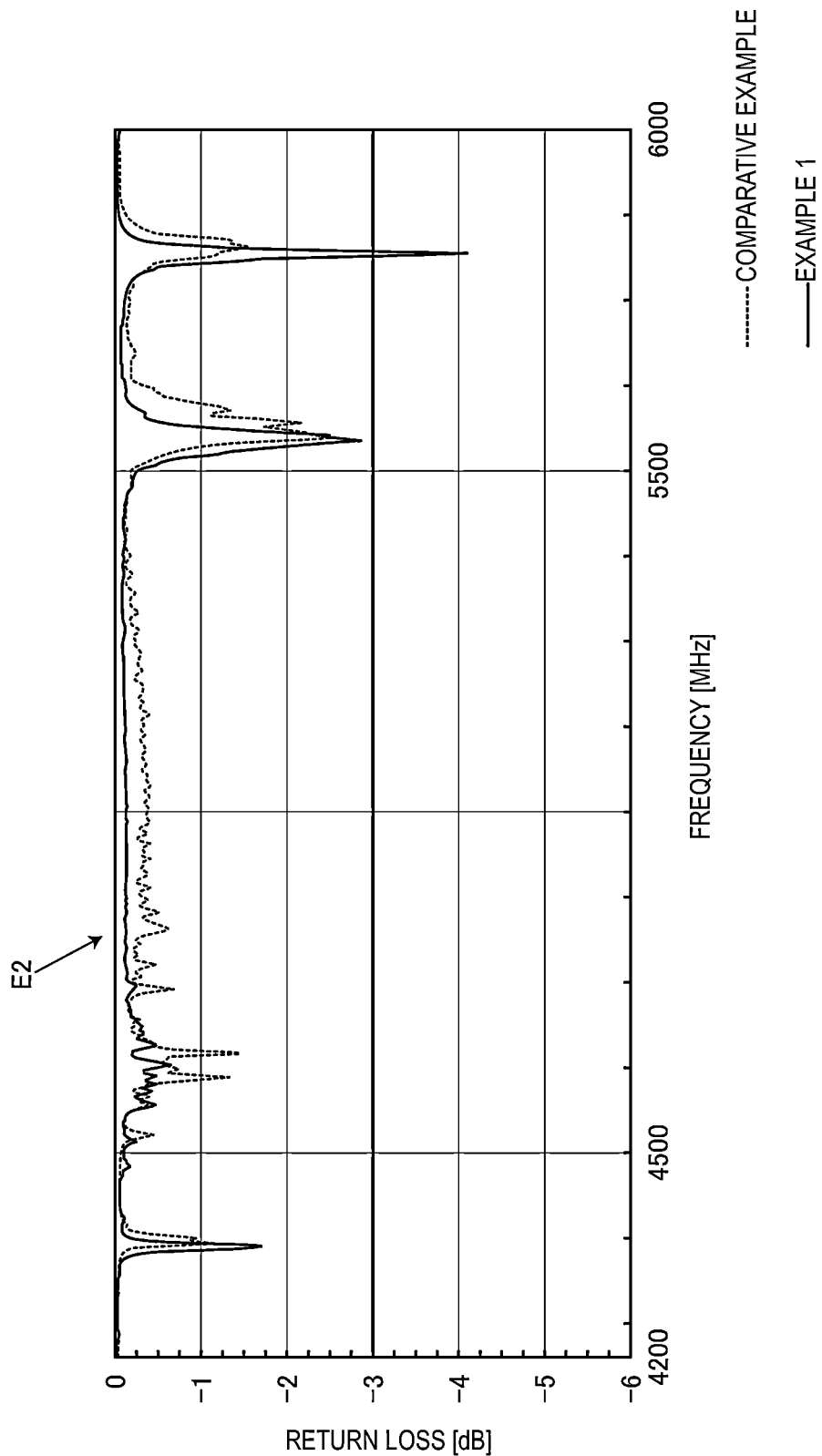
FIG. 17 is a diagram illustrating return loss characteristics of the acoustic wave device according to Example 1 and the acoustic wave device according to Comparative Example.
Figure 18:
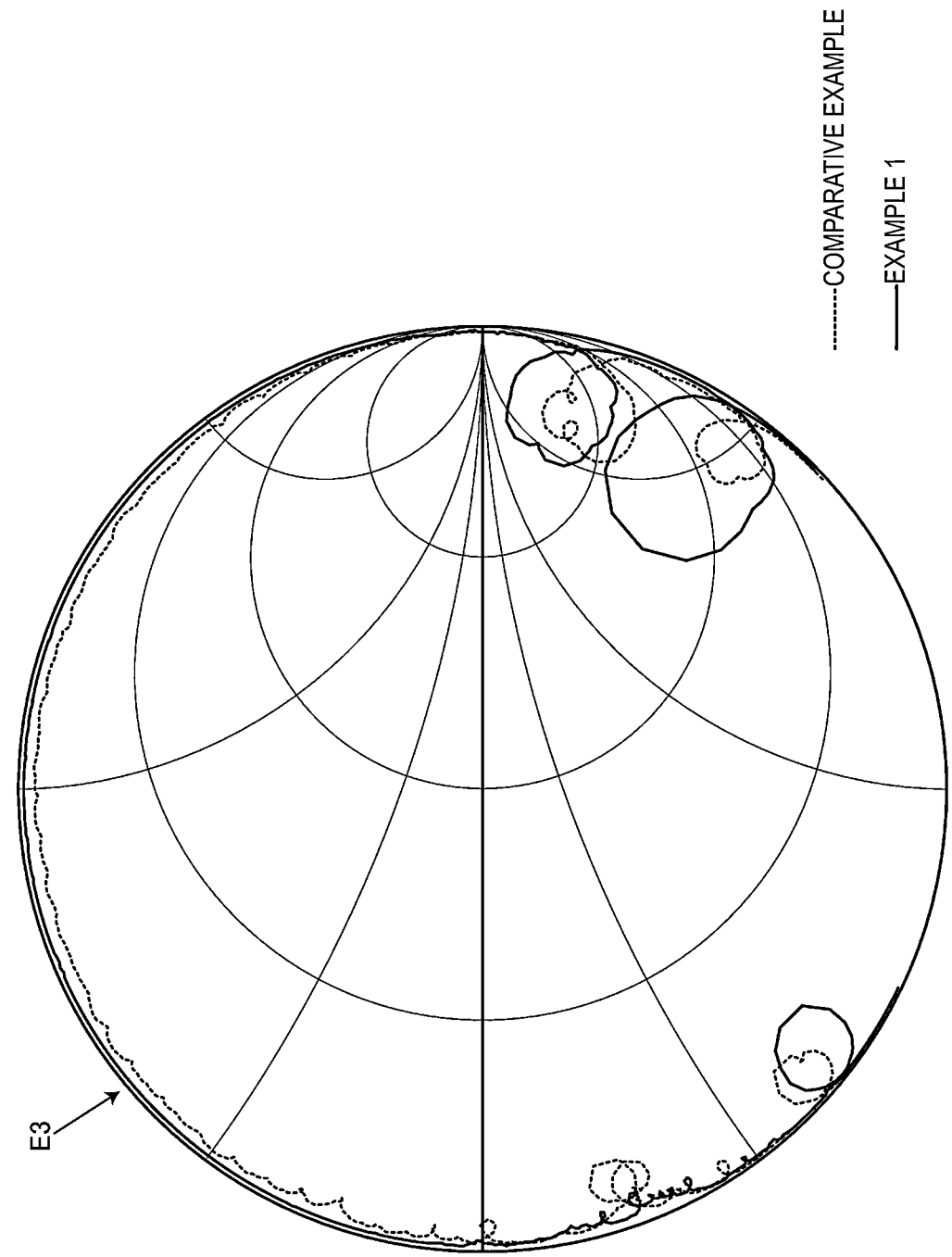
FIG. 18 is a Smith chart of each of the acoustic wave device according to Example 1 and the acoustic wave device according to Comparative Example.

FIG. 15 is a diagram illustrating impedance characteristics of the acoustic wave device according to Example 1 and an acoustic wave device according to Comparative Example. FIG. 16 is a diagram illustrating phase characteristics of the acoustic wave device according to Example 1 and the acoustic wave device according to Comparative Example. FIG. 17 is a diagram illustrating return loss characteristics of the acoustic wave device according to Example 1 and the acoustic wave device according to Comparative Example. FIG. 18 is a Smith chart of each of the acoustic wave device according to Example 1 and the acoustic wave device according to Comparative Example. That is, FIG. 15 to FIG. 18 are diagrams illustrating frequency characteristics of the acoustic wave device 1A according to Example 1 and frequency characteristics of the acoustic wave device according to Comparative Example. Here, the acoustic wave device according to Comparative Example is the acoustic wave device 1A without the first through hole 11 and the second through hole 12. As illustrated in FIG. 15, spurious emission in the acoustic wave device 1A according to Example 1 is reduced as in the acoustic wave device according to Comparative Example. As indicated by arrow E1 in FIG. 16, arrow E2 in FIG. 17, and arrow E3 in FIG. 18, the attenuation of acoustic waves and the energy loss in the acoustic wave device 1A according to Example 1 are smaller than those in the acoustic wave device according to Comparative Example. The presence of the first through hole 11 and the second through hole 12 can thus improve the Q factor.

The acoustic wave device 1A according to the present preferred embodiment is manufactured, for example, by the process described below. Note that the method for manufacturing the acoustic wave device 1A to be described is an example and is not limited to this.

First, the support member 20 is made by joining the dielectric film 7 to the support substrate 8 and forming the hollow 9. The hollow 9 is formed, for example, by making a trench in the dielectric film 7. Next, the hollow 9 is filled with a sacrificial layer, for example, by sputtering. The sacrificial layer is then planarized by chemical mechanical polishing. After the planarization, the piezoelectric layer 2 is joined to the surface of the support member 20 having the sacrificial layer therein, and the piezoelectric layer 2 is made thinner, for example, by chemical mechanical polishing. This is followed by a through hole forming process, in which the etching through hole 10, the first through hole 11, and the second through hole 12 are formed in the piezoelectric layer 2, for example, by applying reactive ion etching to the piezoelectric layer 2. After forming the through holes, a sacrificial layer is temporarily placed on the first principal surface 2a of the piezoelectric layer 2 for protecting the through holes, and the first principal surface 2a is exposed again, for example, by chemical mechanical polishing. Then, the interdigital transducer electrode 30 is placed on the first principal surface 2a of the piezoelectric layer 2, an etching solution is poured in through the etching through hole 10, and the sacrificial layer is etched to form the hollow 9. The acoustic wave device 1A according to the first preferred embodiment is thus manufactured by the process descried above.

Although the acoustic wave device 1A according to the first preferred embodiment has been described, the acoustic wave device according to the present preferred embodiment is not limited to this. Other examples will now be described using the drawings.

Figure 19:
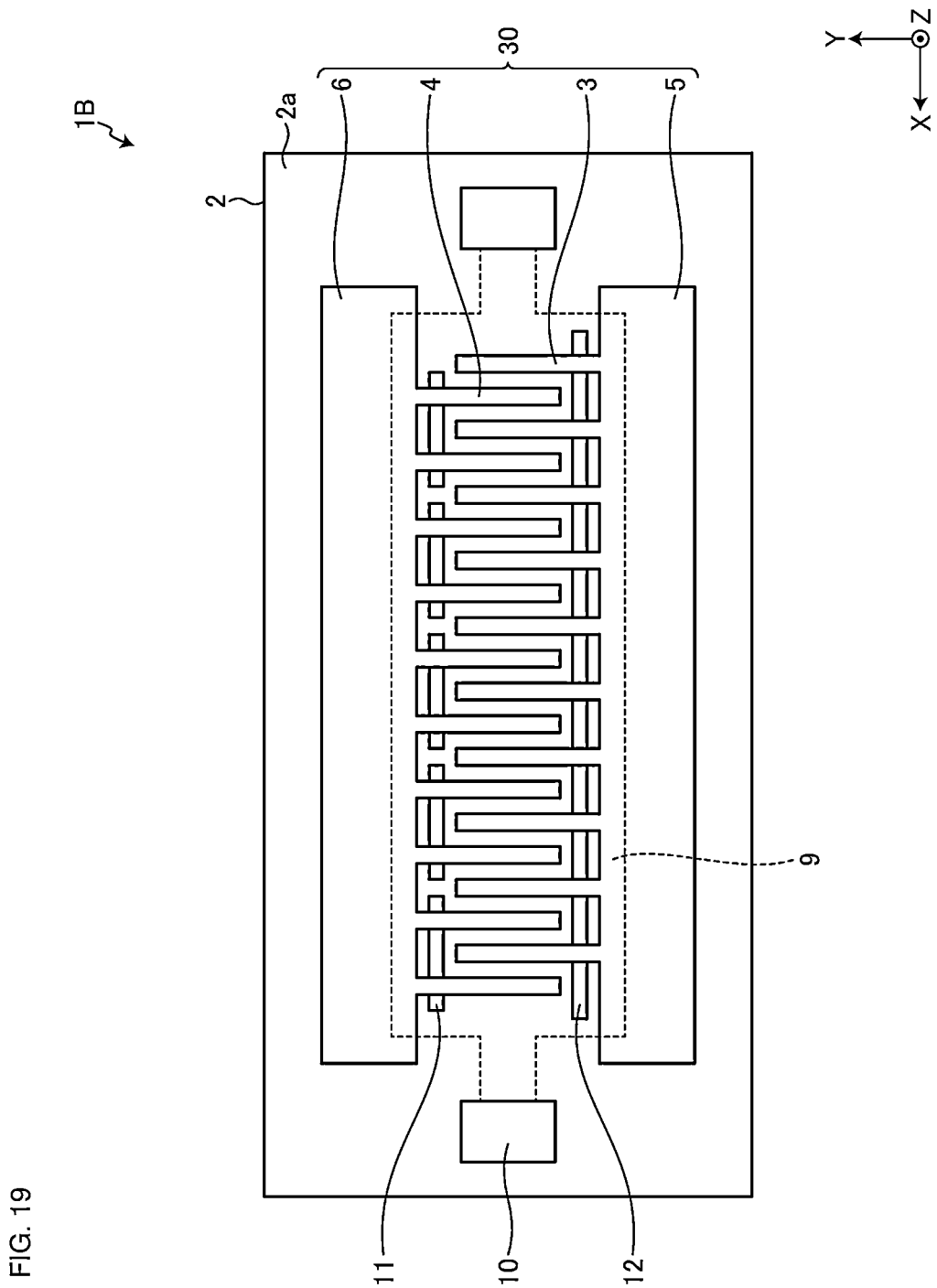
FIG. 19 is a plan view illustrating Example 2 of the acoustic wave device according to the first preferred embodiment of the present invention.

FIG. 19 is a plan view illustrating Example 2 of the acoustic wave device according to the first preferred embodiment. As illustrated in FIG. 19, the piezoelectric layer 2 may include a plurality of first through holes 11. In an acoustic wave device 1B according to Example 2, the plurality of first through holes 11 are arranged at intervals in the X direction. Note that when a plurality of first through holes 11 are provided, the length of the first through holes 11 in the X direction refers to the length of one first through hole 11, and the area of the first through holes 11 refers to the area of one first through hole 11.

The piezoelectric layer 2 may include a plurality of second through holes 12. When a plurality of second through holes 12 are provided, the length of the second through holes 12 in the X direction refers to the total sum of the lengths of the second through holes 12, and the area of the second through holes 12 refers to the area of one second through hole 12.

Figure 20:
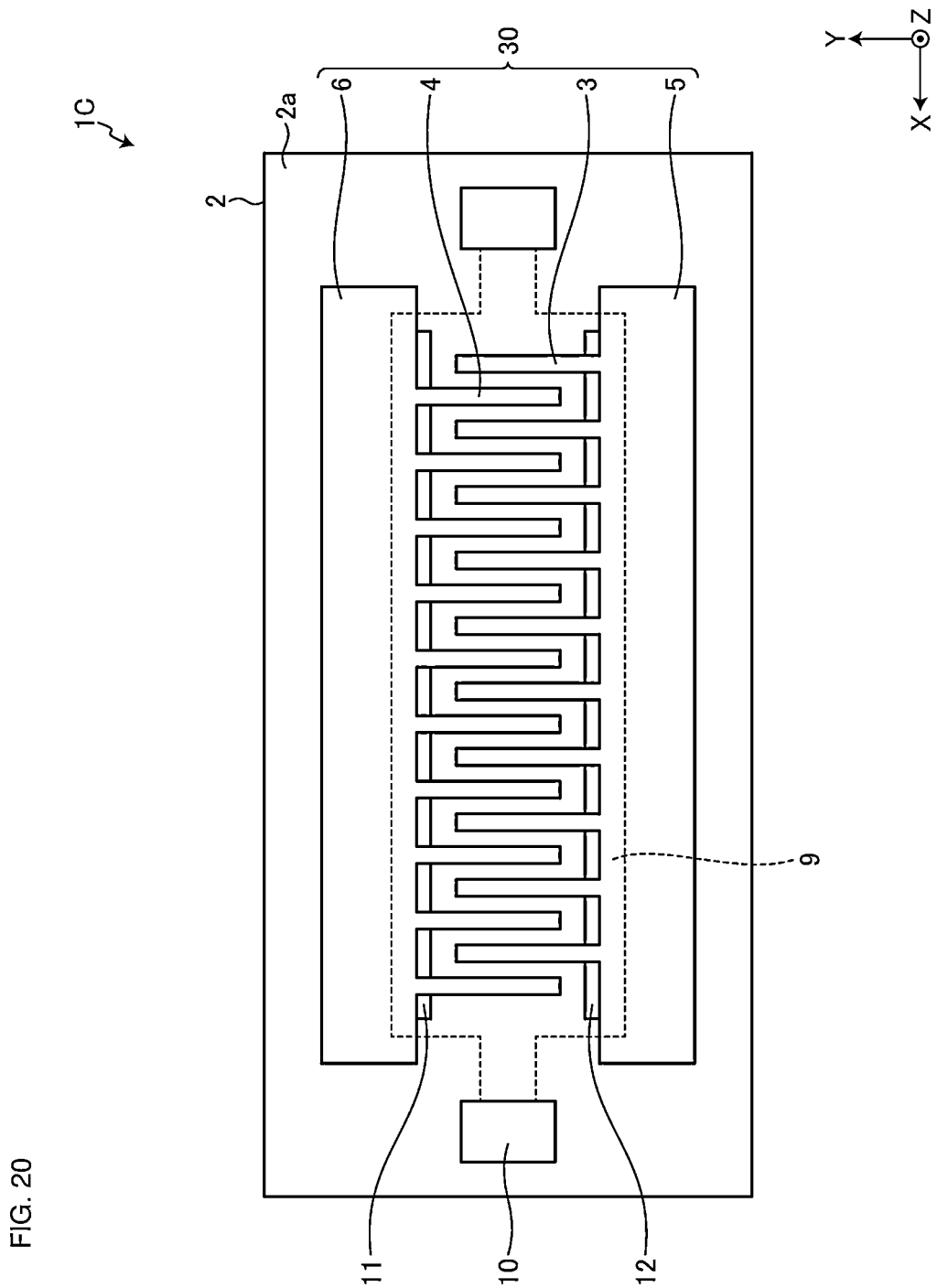
FIG. 20 is a plan view illustrating Example 3 of the acoustic wave device according to the first preferred embodiment of the present invention.
Figure 21:
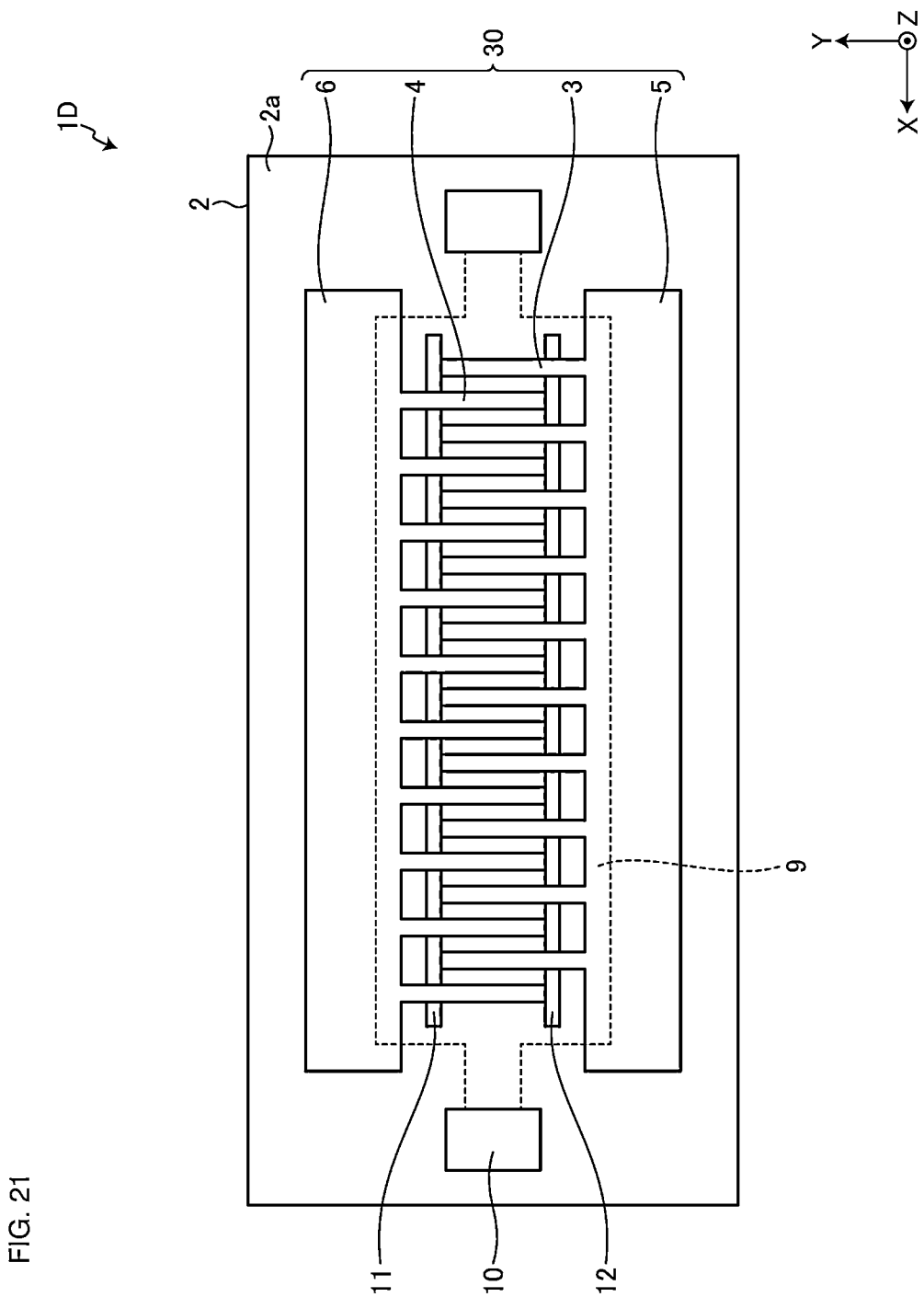
FIG. 21 is a plan view illustrating Example 4 of the acoustic wave device according to the first preferred embodiment of the present invention.

FIG. 20 is a plan view illustrating Example 3 of the acoustic wave device according to the first preferred embodiment. FIG. 21 is a plan view illustrating Example 4 of the acoustic wave device according to the first preferred embodiment. As illustrated in FIG. 20 and FIG. 21, the first through hole 11 and the second through hole 12 may be immediately adjacent to the electrode fingers 3 and 4, or to the busbar electrodes 5 and 6, in plan view in the Z direction. In an acoustic wave device 1C according to Example 3, the first through hole 11 is immediately adjacent to the second busbar electrode 6 and the second through hole 12 is immediately adjacent to the first busbar electrode 5 in plan view in the Z direction. In an acoustic wave device 1D according to Example 4, the first through hole 11 is immediately adjacent to the first electrode fingers 3 and the second through hole 12 is immediately adjacent to the second electrode fingers 4 in plan view in the Z direction.

Figure 22:
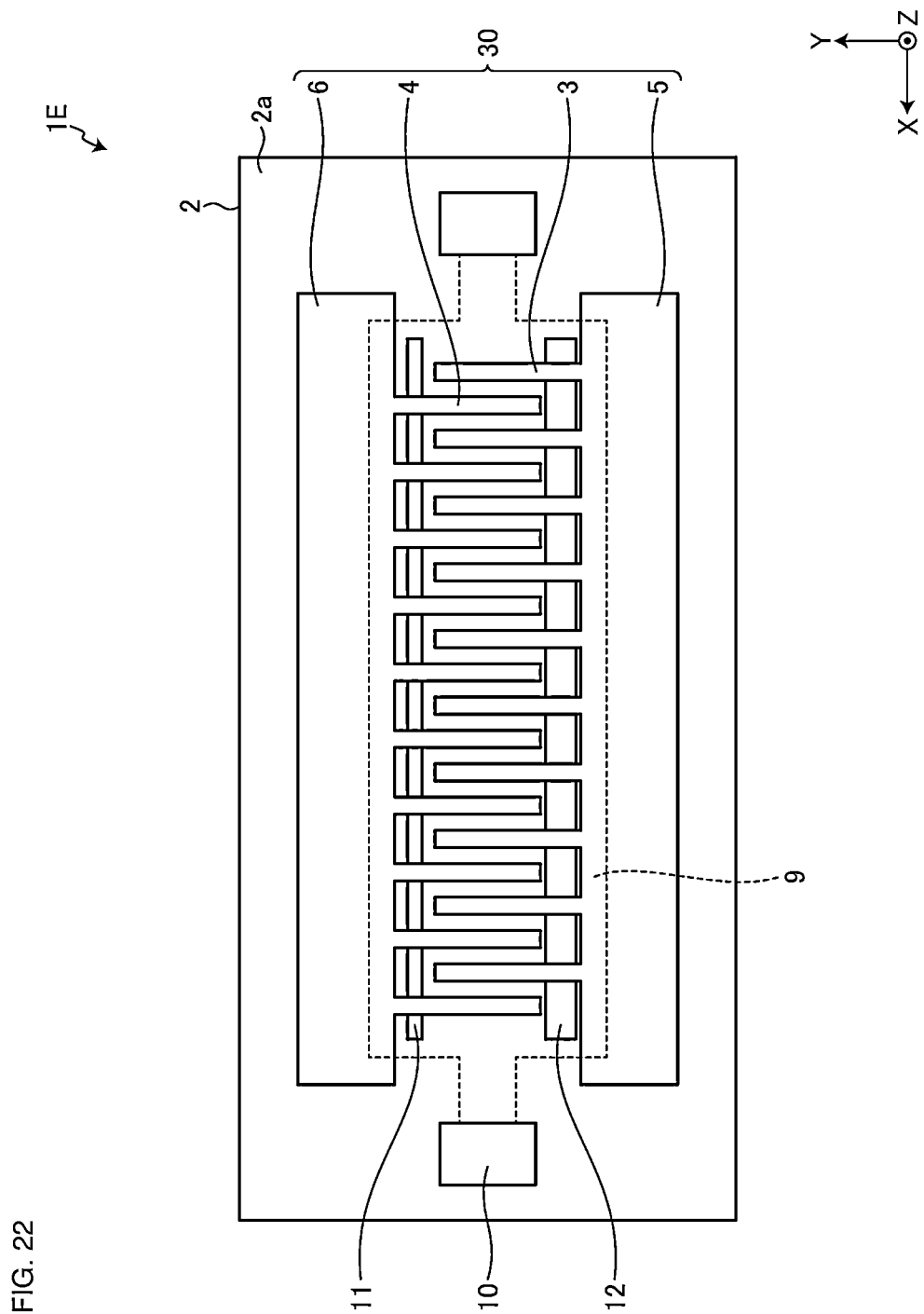
FIG. 22 is a plan view illustrating Example 5 of the acoustic wave device according to the first preferred embodiment of the present invention.
Figure 23:
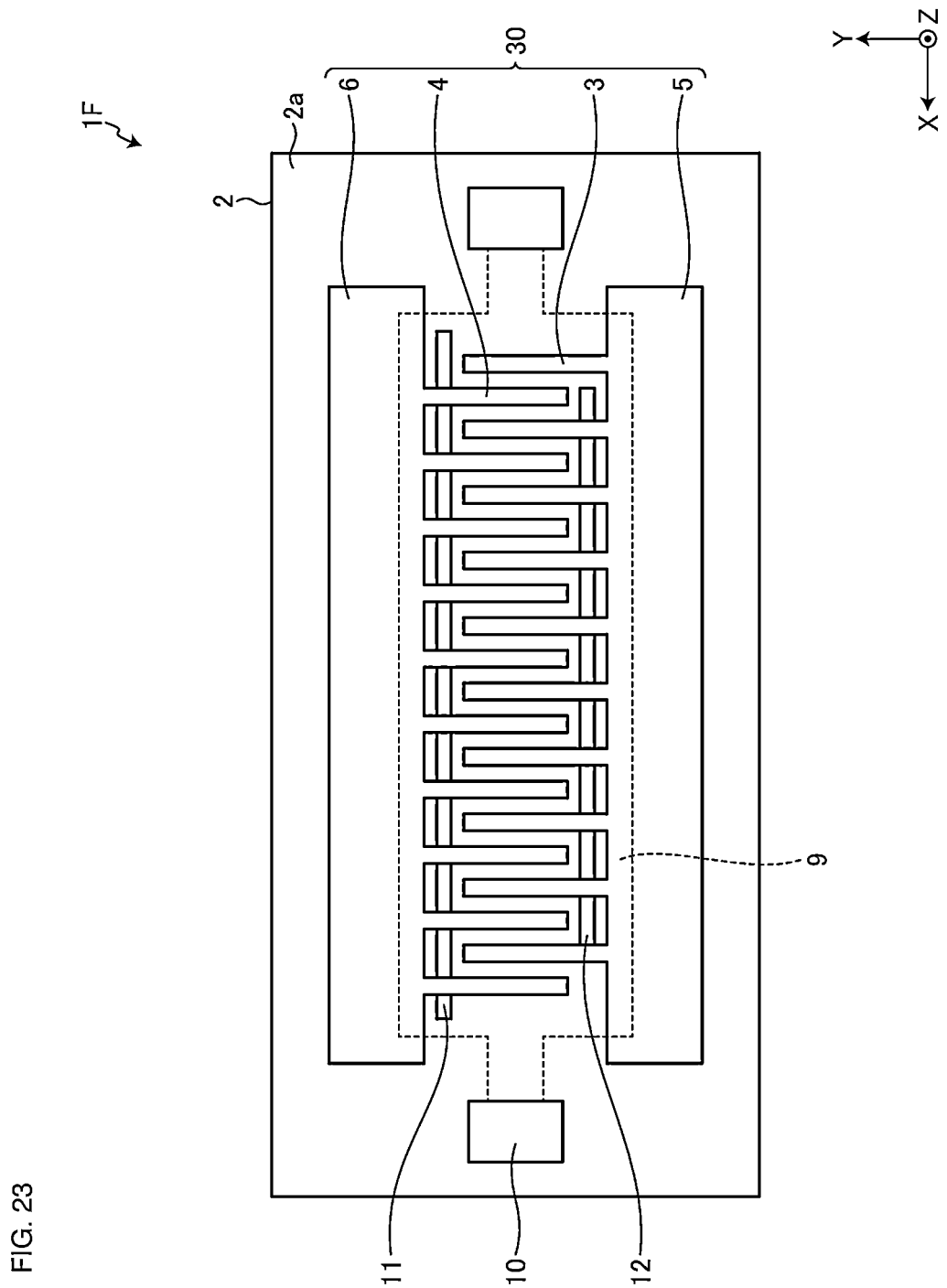
FIG. 23 is a plan view illustrating Example 6 of the acoustic wave device according to the first preferred embodiment of the present invention.

FIG. 22 is a plan view illustrating Example 5 of the acoustic wave device according to the first preferred embodiment. FIG. 23 is a plan view illustrating Example 6 of the acoustic wave device according to the first preferred embodiment. As illustrated in FIG. 22 and FIG. 23, the first through hole 11 and the second through hole 12 may have different areas. In an acoustic wave device 1E according to Example 5, the first through hole 11 and the second through hole 12 differ in length in the Y direction. In an acoustic wave device 1F according to Example 6, the first through hole 11 and the second through hole 12 differ in length in the X direction. This allows selective leakage of spurious emission at a plurality of frequencies, and can reduce spurious emission.

Figure 24:
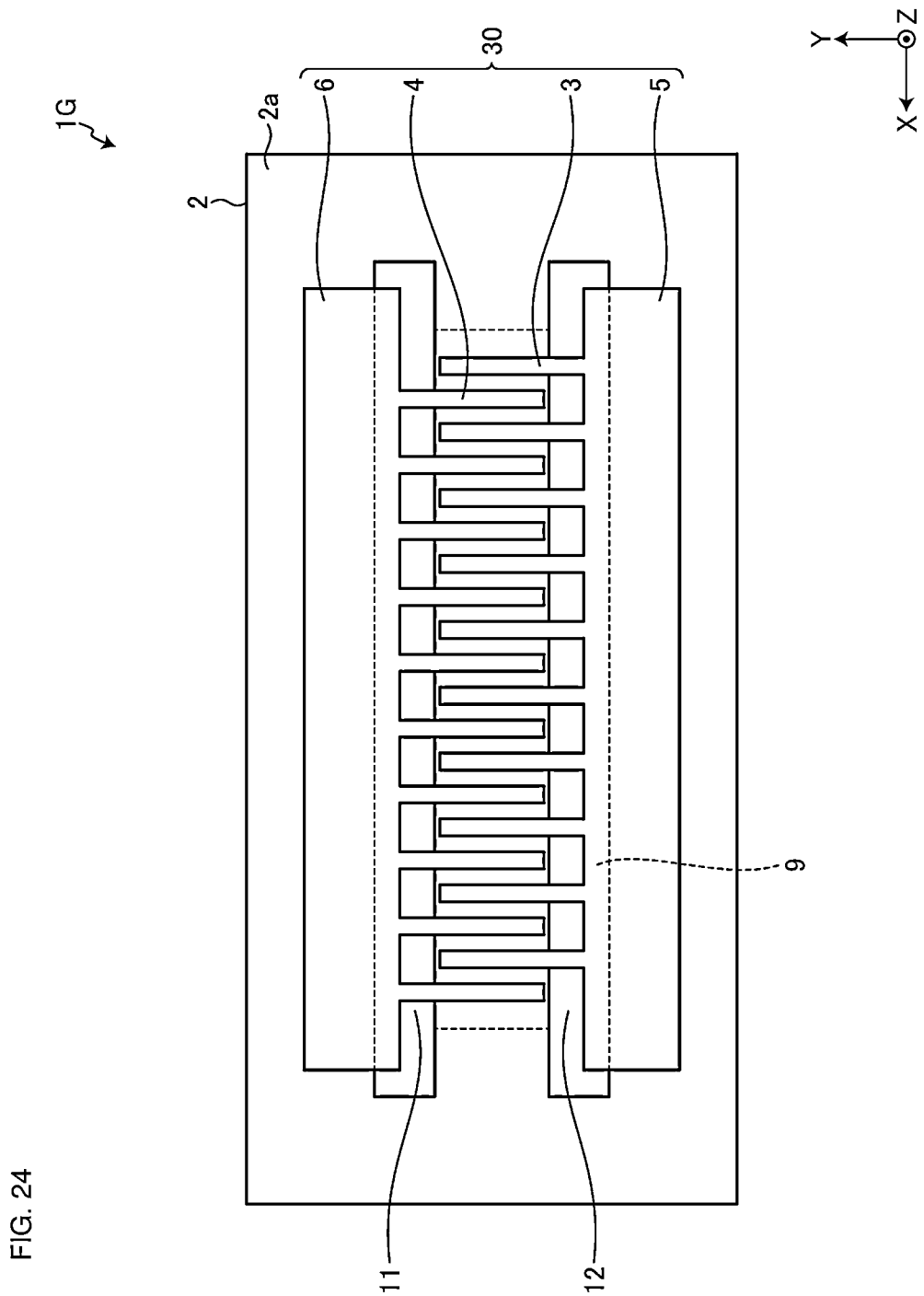
FIG. 24 is a plan view illustrating Example 7 of the acoustic wave device according to the first preferred embodiment of the present invention.

FIG. 24 is a plan view illustrating Example 7 of the acoustic wave device according to the first preferred embodiment. As illustrated in FIG. 24, the first through hole 11 may extend beyond the range of the second busbar electrode 6 in the X direction, and the second through hole 12 may extend beyond the range of the first busbar electrode 5 in the X direction. In an acoustic wave device 1G according to Example 7, the length of the first through hole 11 and the second through hole 12 in the X direction may be greater than the length of the first busbar electrode 5 and the second busbar electrode 6 in the X direction.

As illustrated in FIG. 24, the first through hole 11 may be disposed to overlap a portion of the second busbar electrode 6, and the second through hole 12 may be disposed to overlap a portion of the first busbar electrode 5. In the acoustic wave device 1G according to Example 7, in plan view in the Z direction, the first through hole 11 overlaps a side of the second busbar electrode 6 adjacent to the second electrode fingers 4 in the Y direction and also in plan view in the Z direction, the second through hole 12 overlaps a side of the first busbar electrode 5 adjacent to the first electrode finger 3 in the Y direction.

As illustrated in FIG. 24, the etching through hole 10 may be optional and does not necessarily need to be provided in the piezoelectric layer 2. In the acoustic wave device 1G according to Example 7, the piezoelectric layer 2 does not have the etching through hole 10. In this case, for forming the hollow 9 by etching the sacrificial layer in the process of manufacturing the acoustic wave device 1G, the first through hole 11 or the second through hole 12 is used as a through hole for pouring in the etching solution.

As described above, the acoustic wave device according to the first preferred embodiment includes the support member 20 having a thickness in the first direction, the piezoelectric layer 2 disposed in the first direction of the support member 20, and the interdigital transducer electrode 30 disposed in the first direction of the piezoelectric layer 2 and including the plurality of first electrode fingers 3 extending in the second direction orthogonal to the first direction, the first busbar electrode 5 connecting to the plurality of first electrode fingers 3, the plurality of second electrode fingers 4 extending in the second direction and facing corresponding ones of the plurality of first electrode fingers 3 in the third direction orthogonal to the second direction, and the second busbar electrode 6 connecting to the plurality of second electrode fingers 4. The support member 20 has the hollow 9 on a side thereof adjacent to the piezoelectric layer 2 and the hollow 9 is disposed in a position at least partially overlapping the interdigital transducer electrode 30 in plan view in the first direction. The piezoelectric layer 2 includes at least one first through hole 11 penetrating the piezoelectric layer 2 in a region between at least one first electrode finger 3 and the second busbar electrode 6 in plan view in the first direction. The first through hole 11 communicates with the hollow 9, has a length in the third direction, and overlaps a portion of at least one second electrode finger 4 in plan view in the first direction. With this structure, the acoustic wave device can reduce leakage of acoustic wave energy in the second direction while reducing spurious emission. This can improve the Q factor.

The first through hole 11 overlaps a portion of the plurality of second electrode fingers 4 in plan view in the first direction. This can also improve the Q factor.

The piezoelectric layer 2 includes the plurality of first through holes 11, and the plurality of first through holes 11 are arranged at intervals in the third direction. This can also improve the Q factor.

The first through hole 11 overlaps a portion of the second busbar electrode 6 in plan view in the first direction. This can also improve the Q factor.

In a preferred embodiment, the piezoelectric layer 2 further includes at least one second through hole 12 penetrating the piezoelectric layer 2 in a region between at least one second electrode finger 4 and the first busbar electrode 5 in plan view in the first direction. The second through hole 12 communicates with the hollow 9, has a length in the third direction, and overlaps a portion of at least one first electrode finger 3 in plan view in the first direction. Thus, the acoustic wave device can further reduce leakage of acoustic wave energy in the second direction, and can improve the Q factor.

The second through hole 12 overlaps a portion of the plurality of first electrode fingers 3 in plan view in the first direction. This can also improve the Q factor.

The piezoelectric layer 2 includes the plurality of second through holes 12, and the plurality of second through holes 12 are arranged at intervals in the third direction. This can also improve the Q factor.

The second through hole 12 is disposed to overlap a portion of the first busbar electrode 5 in plan view in the first direction. This can also improve the Q factor.

In a preferred embodiment, the first through hole 11 and the second through hole 12 have different areas in plan view in the first direction. This can reduce spurious emission at a plurality of frequencies.

In a preferred embodiment, the length of the first through hole 11 in the third direction is smaller than the length of the second busbar electrode 6 in the third direction. This can reduce spurious emission at a plurality of frequencies.

In a preferred embodiment, the thickness of the piezoelectric layer 2 is less than or equal to 2p, where p is a center-to-center distance between adjacent first and second electrode fingers 3 and 4 of the plurality of first and second electrode fingers 3 and 4. This can reduce the size of the acoustic wave device 1 and improve the Q factor.

In a more preferred embodiment, the piezoelectric layer 2 includes lithium niobate or lithium tantalate. This makes it possible to provide an acoustic wave device having good resonance characteristics.

In a more preferred embodiment, Euler angles ($\varphi$, $\theta$, $\psi$) of lithium niobate or lithium tantalate forming the piezoelectric layer 2 are in the range defined by numerical expression (1), numerical expression (2), or numerical expression (3) described below. This can sufficiently widen the fractional bandwidth.

$$(0°\pm10°, 0° \text{ to } 20°, \text{any } \psi) \quad \text{numerical expression (1)}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}]$$
$$\text{to } 180°) \quad \text{numerical expression (2)}$$

$$(0°\pm10°, [180°-30°(1-(\psi-90)^2/8100)^{1/2}] \text{ to } 180°, \text{any}$$
$$\psi) \quad \text{numerical expression (3)}$$

In a preferred embodiment, the acoustic wave device is configured to be capable of using thickness shear mode bulk waves. This improves the coupling coefficient and makes it possible to provide an acoustic wave device having good resonance characteristics.

In a preferred embodiment, d/p 0.5 is satisfied, for example, where d is the film thickness of the piezoelectric layer 2 and p is the center-to-center distance between adjacent first and second electrode fingers 3 and 4. This can reduce the size of the acoustic wave device 1 and improve the Q factor.

In a more preferred embodiment, d/p is less than or equal to about 0.24, for example. This can reduce the size of the acoustic wave device 1 and improve the Q factor.

In a preferred embodiment, when a region where adjacent first and second electrode fingers 3 and 4 overlap in a direction in which the adjacent electrode fingers 3 and 4 face each other is the excitation region C, MR≤1.75 (d/p)+0.075 is satisfied, where MR is the metallization ratio of the plurality of first and second electrode fingers 3 and 4 to the excitation region C. This can reliably make the fractional bandwidth less than or equal to about 17%, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support with a thickness extending in a first direction;
   a piezoelectric layer extending in the first direction of the support; and
   an interdigital transducer electrode extending in the first direction of the piezoelectric layer and including a plurality of first electrode fingers extending in a second direction orthogonal to the first direction, a first busbar electrode connected to the plurality of first electrode fingers, a plurality of second electrode fingers extending in the second direction and facing corresponding ones of the plurality of first electrode fingers in a third direction orthogonal to the second direction, and a second busbar electrode connect to the plurality of second electrode fingers; wherein
   the support includes a hollow on a side thereof adjacent to the piezoelectric layer and at least partially overlapping the interdigital transducer electrode in plan view in the first direction;
   the piezoelectric layer includes at least one first through hole penetrating the piezoelectric layer in a region between at least one first electrode finger and the second busbar electrode in plan view in the first direction; and
   the at least one first through hole communicates with the hollow, has a length in the third direction, and overlaps a portion of at least one second electrode finger in plan view in the first direction.

2. The acoustic wave device according to claim 1, wherein the at least one first through hole overlaps a portion of the plurality of second electrode fingers in plan view in the first direction.

3. The acoustic wave device according to claim 1, wherein the at least one first through hole includes a plurality of first through holes; and
   the plurality of first through holes are spaced by intervals in the third direction.

4. The acoustic wave device according to claim 1, wherein the at least one first through hole overlaps a portion of the second busbar electrode in plan view in the first direction.

5. The acoustic wave device according to claim 1, wherein
   the piezoelectric layer includes at least one second through hole penetrating the piezoelectric layer in a region between at least one second electrode finger and the first busbar electrode in plan view in the first direction; and
   the at least one second through hole communicates with the hollow, has a length in the third direction, and overlaps a portion of at least one first electrode finger in plan view in the first direction.

6. The acoustic wave device according to claim 5, wherein the at least one second through hole overlaps a portion of the plurality of first electrode fingers in plan view in the first direction.

7. The acoustic wave device according to claim 5, wherein the at least one second through hole includes a plurality of second through holes; and the plurality of second through holes are spaced by intervals in the third direction.

8. The acoustic wave device according to claim 5, wherein the at least one second through hole overlaps a portion of the first busbar electrode in plan view in the first direction.

9. The acoustic wave device according to claim 5, wherein the at least one first through hole and the at least one second through hole have different areas in plan view in the first direction.

10. The acoustic wave device according to claim 1, wherein a length of the at least one first through hole in the third direction is smaller than a length of the second busbar electrode in the third direction.

11. The acoustic wave device according to claim 1, wherein a thickness of the piezoelectric layer is less than or equal to about 2p, where p is a center-to-center distance between adjacent first and second electrode fingers of the plurality of first and second electrode fingers.

12. The acoustic wave device according to claim 1, wherein the piezoelectric layer includes lithium niobate or lithium tantalate.

13. The acoustic wave device according to claim 12, wherein Euler angles ($\phi$, $\theta$, $\psi$) of the lithium niobate or the lithium tantalate of the piezoelectric layer are in a range defined by numerical expression (1), numerical expression (2) or numerical expression (3):

$$(0°\pm10°, 0° \text{ to } 20°, \text{any } \psi) \quad \text{numerical expression (1);}$$

$$(0°\pm10°, 20° \text{ to } 80°, 0° \text{ to } 60°(1-(\theta-50)^{2/900})^{1/2}) \text{ or}$$
$$(0°\pm10°, 20° \text{ to } 80°, [180°-60°(1-(\theta-50)^{2/900})^{1/2}] \text{ to } 180°) \quad \text{numerical expression (2); and}$$

$$(0°\pm10°, [180°-30°(1-(\psi-90)^2/8100)^{1/2}] \text{ to } 180°, \text{any } \psi) \quad \text{numerical expression (3).}$$

14. The acoustic wave device according to claim 12, wherein the acoustic wave device is capable of using thickness shear mode bulk waves.

15. The acoustic wave device according to claim 14, wherein d/p≤0.5 is satisfied, where d is a thickness of the piezoelectric layer and p is a center-to-center distance between adjacent first and second electrode fingers of the plurality of first and second electrode fingers.

16. The acoustic wave device according to claim 15, wherein d/p is less than or equal to about 0.24.

17. The acoustic wave device according to claim 1, wherein when a region where adjacent first and second electrode fingers overlap in a direction in which the adjacent first and second electrode fingers face each other, as viewed in the third direction, is an excitation region, MR≤1.75 (d/p)+0.075 is satisfied, where MR is a metallization ratio of the plurality of first and second electrode fingers to the excitation region, d is a thickness of the piezoelectric layer, and p is a center-to-center distance between adjacent first and second electrode fingers.

18. The acoustic wave device according to claim 1, wherein no reflectors are included in the acoustic wave device.

19. The acoustic wave device according to claim 1, wherein the acoustic wave device is capable of using plate waves or Lamb waves.

20. The acoustic wave device according to claim 1, further comprising reflectors on both sides of the first and second electrode fingers.

* * * * *